US007941232B2

(12) United States Patent
Ishii et al.

(10) Patent No.: US 7,941,232 B2
(45) Date of Patent: May 10, 2011

(54) CONTROL METHOD, CONTROL SYSTEM, AND PROGRAM

(75) Inventors: Yuuki Ishii, Yokohama (JP); Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 343 days.

(21) Appl. No.: 11/521,511

(22) Filed: Sep. 15, 2006

(65) Prior Publication Data

US 2008/0221709 A1    Sep. 11, 2008

Related U.S. Application Data

(63) Continuation of application No. PCT/JP2005/011727, filed on Jun. 27, 2005.

(60) Provisional application No. 60/717,328, filed on Sep. 15, 2005.

(30) Foreign Application Priority Data

Jun. 29, 2004  (JP) ................................ 2004-191319

(51) Int. Cl.
  G05B 13/02   (2006.01)
  G03F 1/00    (2006.01)
  G03F 9/00    (2006.01)
  G03C 5/00    (2006.01)
  G01B 9/00    (2006.01)
  G06K 9/00    (2006.01)
(52) U.S. Cl. .................. 700/29; 430/5; 430/22; 430/30; 356/124; 356/125; 382/144; 382/145; 382/149
(58) Field of Classification Search ................ 430/5, 22, 430/30; 356/124, 125; 700/28, 29; 382/144, 382/145, 149
See application file for complete search history.

(56) References Cited

U.S. PATENT DOCUMENTS

| 5,448,332 A | 9/1995 | Sakakibara et al. |
| 5,502,311 A | 3/1996 | Imai et al. |
| 5,534,970 A | 7/1996 | Nakashima et al. |
| 5,646,413 A | 7/1997 | Nishi |

(Continued)

FOREIGN PATENT DOCUMENTS

JP    A 05-190423    7/1993

(Continued)

OTHER PUBLICATIONS

Aug. 11, 2010 Notification of Reasons for Refusal issued in JP 2006-528662 with English-language translation.

(Continued)

*Primary Examiner* — Albert DeCady
*Assistant Examiner* — Sunray R Chang
(74) *Attorney, Agent, or Firm* — Oliff & Berridge, PLC

(57) ABSTRACT

By repeatedly executing a predetermined measurement at set intervals, data on a predetermined performance (a best focus position) of a predetermined apparatus and data on variation factors of the performance are obtained (Steps 204 to 214). Based on the obtained data, multivariate analysis is performed and a model equation that is used to predict a variation amount of the performance and includes at least one of the variation factors as a variable is derived (Step 214). Therefore, after deriving the model equation, a variation amount of the performance can be predicted using the model equation by obtaining data on the variation factor that serves as the variable (Step 238). Accordingly, it becomes possible to maintain the performance described above with good accuracy in accordance with the prediction results and also optimize the implementation timing of maintenance and the like.

30 Claims, 5 Drawing Sheets

U.S. PATENT DOCUMENTS

| | | | |
|---|---|---|---|
| 6,157,041 A * | 12/2000 | Thomas et al. | 250/573 |
| 6,381,554 B1 * | 4/2002 | Matsuo et al. | 702/174 |
| 6,528,809 B1 * | 3/2003 | Thomas et al. | 250/573 |
| 6,549,864 B1 * | 4/2003 | Potyrailo | 702/81 |
| 7,167,766 B2 * | 1/2007 | Lam et al. | 700/96 |
| 2002/0010563 A1 * | 1/2002 | Ratteree et al. | 703/2 |
| 2003/0013213 A1 | 1/2003 | Takano | |
| 2004/0042648 A1 * | 3/2004 | Yoshidda et al. | 382/151 |
| 2004/0049898 A1 | 3/2004 | Imai et al. | |
| 2004/0138773 A1 | 7/2004 | Tomoyasu | |
| 2004/0235302 A1 | 11/2004 | Doan et al. | |
| 2004/0235304 A1 | 11/2004 | Oh | |
| 2005/0118812 A1 | 6/2005 | Donohue et al. | |
| 2005/0143952 A1 | 6/2005 | Tomoyasu et al. | |
| 2005/0146709 A1 | 7/2005 | Oh et al. | |

FOREIGN PATENT DOCUMENTS

| | | |
|---|---|---|
| JP | A 05-275313 | 10/1993 |
| JP | A 06-283403 | 10/1994 |
| JP | A 06-349701 | 12/1994 |
| JP | A 07-176468 | 7/1995 |
| JP | A 09-320945 | 12/1997 |
| JP | A 11-258498 | 9/1999 |
| JP | A 2002-014005 | 1/2002 |
| JP | 2002-151377 | 5/2002 |
| JP | A 2003-022962 | 1/2003 |
| JP | A 2003-197609 | 7/2003 |
| JP | A 2004-039952 | 2/2004 |
| JP | A 2004-047885 | 2/2004 |
| JP | A 2004-207703 | 7/2004 |
| WO | WO 99/49504 A1 | 9/1999 |
| WO | WO 03/058687 A1 | 7/2003 |
| WO | WO 03/105210 A1 | 12/2003 |
| WO | WO 2004/019396 A1 | 3/2004 |

OTHER PUBLICATIONS

Oct. 11, 2005 Written Opinion of the International Search Authority issued in corresponding International Application No. PCT/JP2005/011727 with English-language translation.

* cited by examiner

CONTROL METHOD, CONTROL SYSTEM, AND PROGRAM

CROSS-REFERENCE TO RELATED APPLICATIONS

This application is a continuation of International Application PCT/JP2005/011727, with an international filing date of Jun. 27, 2005, the disclosure of which is hereby incorporated herein by reference in its entirety, which was not published in English. This non-provisional application also claims the benefit of Provisional Application No. 60/717,328 filed Sep. 15, 2005, the disclosure of which is hereby incorporated herein by reference in its entirety.

BACKGROUND OF THE INVENTION

1. Field of the Invention

The present invention relates to control methods, control systems and programs, and more particularly to a control method and a control system that control the performance of a predetermined apparatus, and a program that makes a computer that controls the performance of the predetermined apparatus execute a predetermined procedure.

2. Description of the Background Art

Conventionally, in a lithographic process for manufacturing microdevices such as semiconductor devices (integrated circuits), liquid-crystal display devices, imaging devices such as CCD, and thin film magnetic heads, various types of exposure apparatuses to form a circuit pattern on an object to be exposed such as a wafer or a glass plate (hereinafter generally referred to as a 'wafer') have been used. In recent years, due to higher integration of semiconductor devices, the increase in size of a wafer and the like, in order to transfer a fine pattern on a wafer with high throughput, sequentially moving type projection exposure apparatuses are mainly used, such as a reduction projection exposure apparatus by a step-and-repeat method (the so-called stepper) or a scanning projection exposure apparatus by a step-and-scan method (the so-called scanning stepper (also called as a 'scanner')) that is an improvement of the stepper.

When manufacturing microdevices such as semiconductor devices, it is normal to perform overlay exposure in order to form and overlay multiple layers of different circuit patterns on a wafer. Therefore, as basic capability to mass-produce microdevices of higher integration, a projection exposure apparatus requires not only throughput but also high overlay accuracy (relative position accuracy when forming a pattern on a wafer and further forming another pattern on the wafer in the next process).

In order to constantly maximize the capability, in the projection exposure apparatus, performance control of various types is performed by periodic maintenance and the like. For improving the overlay accuracy, it is necessary to maintain the image-forming performance of a projection optical system in good condition as well as high resolution. The control of the image-forming performance of the projection optical system, as an example, the control of focus has been performed as follows.

a. Measurement of a best focus position of the projection optical system is executed with predetermined frequency, for example, once a day. In the measurement, an aerial image measurement, in which a projected image (an aerial image) of a measurement mark by a projection optical system is measured using an aerial image measurement unit. At least a part of the aerial image measurement unit is arranged on a wafer stage on which a wafer is mounted, and the aerial measurement is repeatedly performed while changing the position of the wafer stage in an optical axis direction of the projection optical system in predetermined pitch, and the best focus position of the projection optical system is measured in a predetermined method based on each aerial image intensity signal that is obtained as a result of the aerial measurement (refer to Kokai (Japanese Unexamined Patent Application Publication) No. 2002-014005).

b. A focus variation amount that is obtained as a result of the above 'a' is compared with a permissible value set in advance, and in the case the focus variation amount exceeds the permissible value, the focus variation mount is confirmed by a test exposure. The best focus has been determined by the test exposure as follows.

That is, first, an image of a focus measurement mark is transferred to different positions on the wafer, while changing the position of the wafer stage in the optical axis direction in a predetermined pitch or changing an exposure amount (a dose amount) irradiated onto the wafer by a predetermined amount. Next, the wafer is developed, and a matrix (which is called a focus-exposure amount matrix (FEM)) is formed on the wafer. The matrix has, as an element, an area where transferred images (resist images) of the focus measurement mark at different positions of the wafer stage in the optical axis direction or the transferred images of the focus measurement mark with different dose amounts are formed, and the focus position that corresponds to a row in which a finest pattern is resolved among the rows of the matrix is to be the best focus position (refer to Kokai (Japanese Unexamined Patent Application Publication) No. 09-320945).

c. Then, based on the obtained best focus position, calibration of a focus sensor is executed.

In the method above, when the best focus position is to be controlled with higher accuracy, the permissible value described earlier needs to be smaller. However, when the permissible value becomes smaller, the focus variation amount obtained as the result of 'a' exceeds the permissible value and confirmation of the focus variation amount by the test exposure described above (such as exposure, development, and measurement of a resist image) is performed, almost every time.

In the case periodic exposure, development, measurement of a resist image and the like are performed for the check of the best focus position, however, the measurement takes a long period of time, which necessarily leads to the increase in downtime of the apparatus. The control of image-forming performances of the projection optical system besides the best focus position can be performed by combining the aerial image measurement and the test exposure in the same manner as described above.

Further, besides the image-forming performances of the projection optical system, for example, in order to control the position control performance of a stage (including synchronization accuracy of a reticle stage and a wafer stage in the case of the scanner), a check operation of the position control performance by the same test exposure as is described above has been performed periodically (for example, every few days). Therefore, the measurement takes a long period of time, which necessarily leads to the increase in downtime of the apparatus.

Against the background described above, a new system or the like is expected that can control with high accuracy the image-forming performances of projection optical systems, the position control performance of stages and other performances of exposure apparatuses, and also can reduce downtime of the apparatus.

SUMMARY OF THE INVENTION

The present invention has been made in consideration of the situation described above, and according to a first aspect of the present invention, there is provided a control method in which a performance of a predetermined apparatus is controlled, the method comprising: obtaining data related to a predetermined performance of the predetermined apparatus and data on variation factors of the performance by repeatedly executing a predetermined measurement at least one of at a set timing and set intervals; and deriving a model equation used to predict a variation amount of the performance that includes at least one of the variation factors as a variable, by performing multivariate analysis based on the obtained data.

In the present description, 'data related to a predetermined performance' includes not only data on a predetermined performance as a matter of course, but also data on a variation amount of the predetermined performance and the like.

With this method, a predetermined measurement is repeatedly executed at least one of at a set timing and set intervals, and data related to a predetermined performance of a predetermined apparatus and data on variation factors of the performance are obtained, then multivariate analysis is performed based on the obtained data and a model equation used to predict a variation amount of the performance that includes at least one of the variation factors as a variable is derived. Therefore, after the model equation is derived, by appropriately obtaining data on the variation factor which serves as the variable, a variation amount of the performance can be predicted using the model equation and the performance above can be maintained with good accuracy based on the prediction results, and also the implementation timing of maintenance and the time required for the maintenance can be optimized. Accordingly, operation efficiency of the apparatus can be improved by reduction in downtime of the apparatus, while maintaining the performance of the apparatus.

According to a second aspect of the present invention, there is provided a control system that controls a performance of a predetermined apparatus, the system comprising: a data obtaining unit that obtains data related to a predetermined performance of the predetermined apparatus and data on variation factors of the performance by repeatedly executing a predetermined measurement at least one of at a set timing and at set intervals; and a model equation deriving unit that derives a model equation used to predict a variation amount of the performance that includes at least one of the variation factors as a variable, by performing multivariate analysis based on the obtained data.

With this system, the data obtaining unit repeatedly executes a predetermined measurement at least one of at a set timing and at set intervals and obtains data related to a predetermined performance of a predetermined apparatus and data on variation factors of the performance. Then, the model equation deriving unit performs multivariate analysis based on the obtained data, and derives a model equation used to predict a variation amount of the performance that includes at least one of the variation factors as a variable. Therefore, after the model equation is derived, by appropriately obtaining data on the variation factor which serves as the variable, a variation amount of the performance can be predicted using the model equation and the performance above can be maintained with good accuracy based on the prediction results, and also the implementation timing of maintenance and the time required for the maintenance can be optimized. Accordingly, operation efficiency of the apparatus can be improved by reduction in downtime of the apparatus, while maintaining the performance of the apparatus.

According to a third aspect of the present invention, there is provided a program that makes a computer that controls a performance of a predetermined apparatus execute a predetermined procedure, the program making the computer execute: a procedure of obtaining data related to a predetermined performance of the predetermined apparatus and data on variation factors of the performance by repeatedly executing a predetermined measurement at least one of at a set timing and at set intervals; and a procedure of deriving a model equation used to predict a variation amount of the performance that includes at least one of the variation factors as a variable, by performing multivariate analysis based on the obtained data.

The computer in which this program is installed repeatedly executes a predetermined measurement at least one of at a set timing and at set intervals and obtains data related to a predetermined performance of a predetermined apparatus and data on variation factors of the performance. Then, the computer performs multivariate analysis based on the obtained data, and derives a model equation used to predict a variation amount of the performance that includes at least one of the variation factors as a variable. Therefore, after the model equation is derived, by appropriately obtaining data on the variation factor which serves as the variable, a variation amount of the performance can be predicted using the model equation and the performance above can be maintained with good accuracy based on the prediction results, and also the implementation timing of maintenance and the time required for the maintenance can be optimized. Accordingly, operation efficiency of the apparatus can be improved by reduction in downtime of the apparatus, while maintaining the performance of the apparatus.

BRIEF DESCRIPTION OF THE DRAWINGS

In the accompanying drawings.

DESCRIPTION OF THE EMBODIMENTS

Figure 1:
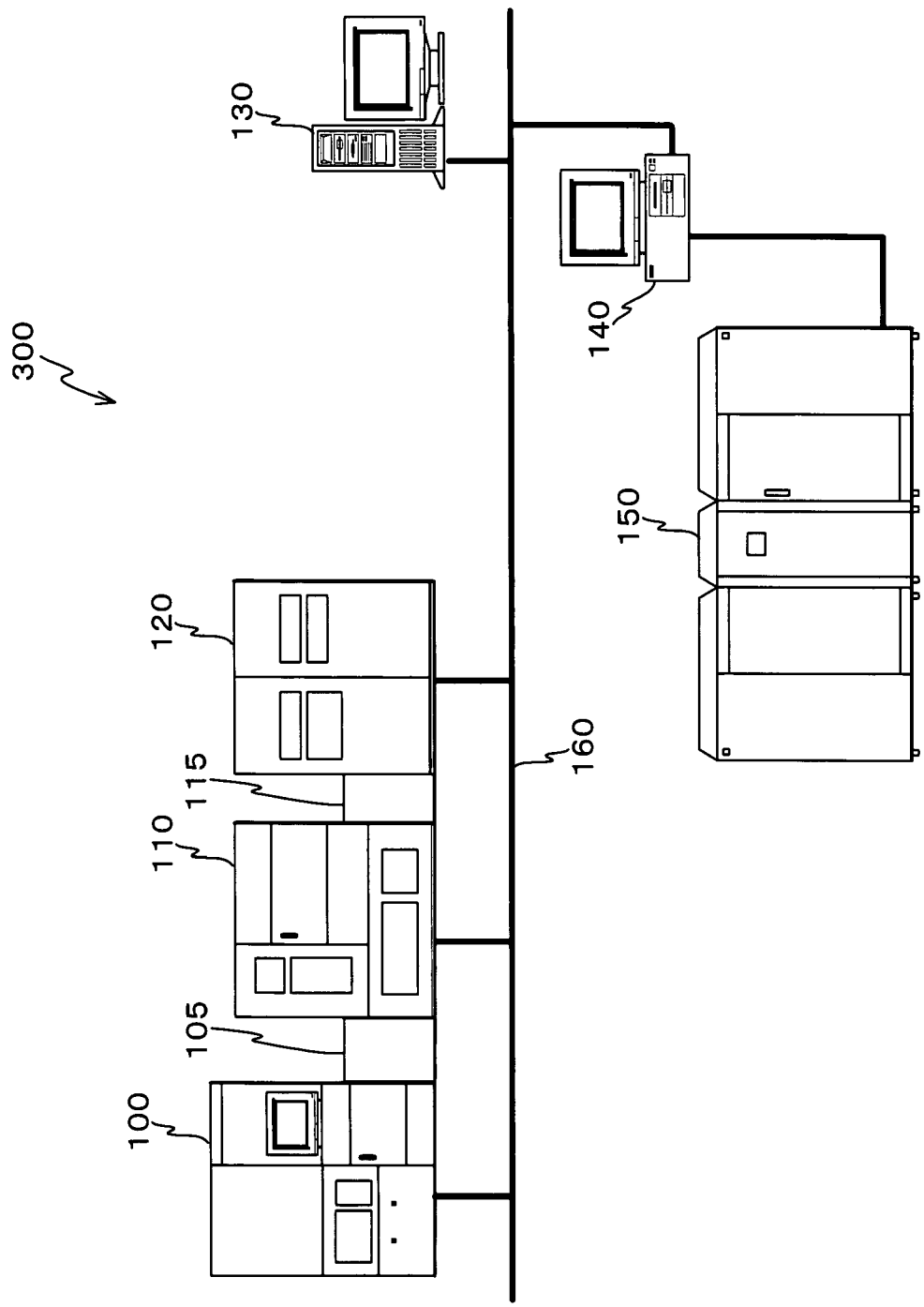
FIG. 1 is a view schematically showing an entire configuration of a lithography system in which a control method related to an embodiment is implemented.

An embodiment of the present invention will be described based on FIGS. 1 to 5B. FIG. 1 schematically shows the entire configuration of a lithography system 300 in which a control method related to an embodiment is implemented.

Lithography system 300 is equipped with an exposure apparatus 100, a coater developer (hereinafter shortened to a 'C/D') 110 that connects in-line to exposure apparatus 100, an overlay measurement unit 120 that connects in-line to exposure apparatus 100 via C/D 110 and used also as an image measurement unit, a control server 130, a terminal server 140, a host computer 150 and the like. Exposure apparatus 100, C/D 110, overlay measurement unit 120, control server 130 and terminal server 140 connect to one another via a local area network (LAN) 160. Further, host computer 150 connects to LAN160 via terminal server 140. That is, in a hardware configuration, a communication path is secured between exposure apparatus 100, C/D 110, overlay measurement unit 120, control server 130, terminal server 140 and host computer 150.

In the embodiment, exposure apparatus 100 is to be a projection exposure apparatus by a step-and-scan method (a scanning exposure apparatus). The configuration of exposure apparatus 100 and the like will be described later. Incidentally, another exposure apparatus, C/D and the like connect to LAN160, though they are not shown in the drawings.

C/D 110 performs the coating of resist onto a wafer and development of the wafer after exposure. In the embodiment, C/D 110 connects in-line to exposure apparatus 100 and overlay measurement unit 120 via interface sections 105 and 115 respectively.

Inside interface section 105 that connects exposure apparatus 100 to C/D 110 in-line, a delivery section (not shown) used to deliver a wafer between exposure apparatus 100 and C/D 110 is arranged. Further, C/D 110 has a carrier system of a wafer therein, and a wafer subject to processing is circulated and carried in constant procedures between a coating section where a coating process is performed, a developing section where a developing process is performed, and the delivery section. Further, exposure apparatus 100 also has a carrier system therein, and a wafer subject to processing is circulated and carried between a wafer stage where exposure to a wafer subject to processing is performed and the delivery section. Inside C/D 110, a cooling section, a bake section, and a buffer section to temporally keep a wafer subject to processing are also arranged.

As can be seen from the arrangement in FIG. 1, C/D 110 also serves as a path of a wafer between exposure apparatus 100 and overlay measurement unit 120.

Inside interface section 115 that connects C/D 110 to overlay measurement unit 120 in-line, a delivery section used to deliver a wafer between C/D 110 and overlay measurement unit 120 is arranged.

Overlay measurement unit 120 is equipped with a microcomputer (not shown) as a control section thereof, and by the microcomputer performing a processing according to a predetermined program, for example, overlay error measurement is executed to wafers of many lots (e.g. 25 wafers in a lot) that are processed continuously; to several wafers at the head of each lot, wafers at predetermined intervals, or to pilot wafers (test wafers).

In other words, the pilot wafer described above or the like is exposed by a predetermined exposure apparatus according to a process, and is sent to, for example, exposure apparatus 100 in a state where one or more layers are already formed. Exposure apparatus 100 actually transfers a pattern (the pattern includes an overlay measurement mark) of a reticle, and then a processing such as development is performed by the C/D and the pilot wafer or the like is sent to overlay measurement unit 120. Then, overlay measurement unit 120 measures an overlay error (a relative position error) between images (e.g. resist images) of the overlay measurement marks, for example, Bar-in-Bar marks (or Box-in-Box marks) that are formed when exposing different layers on the wafer that has been sent to overlay measurement unit 120, and further computes overlay error information by performing a predetermined computation. That is, overlay measurement unit 120 measures the overlay error information of each pilot wafer in this manner.

The microcomputer that overlay measurement unit 120 comprises performs communication with a main controller, which will be described later, of exposure apparatus 100 via LAN160, and performs the operations as described above. Further, the microcomputer that overlay measurement unit 120 comprises performs communication with control server 130 via LAN 160 and receives predetermined data such as overlay error data. In addition, the microcomputer that overlay measurement unit 120 comprises performs communication with host computer 150 via LAN160 and terminal server 140.

Control server 130 is configured by a medium scale computer equipped with a large capacity storage. In the embodiment, control server 130 performs the control of performances of exposure apparatus 100 as will be described later.

Terminal server 140 is configured as a gateway processor used to absorb differences between a communication protocol in LAN160 and a communication protocol of host computer 150. This function of terminal server 140 makes it possible to perform communication between host computer 150, and exposure apparatus 100, C/D 110 and overlay measurement unit 120 that connect to LAN160.

Host computer 150 is configured by a large scale computer, and in the embodiment, performs the overall control of wafer processing processes at least including a lithography process.

Figure 2:
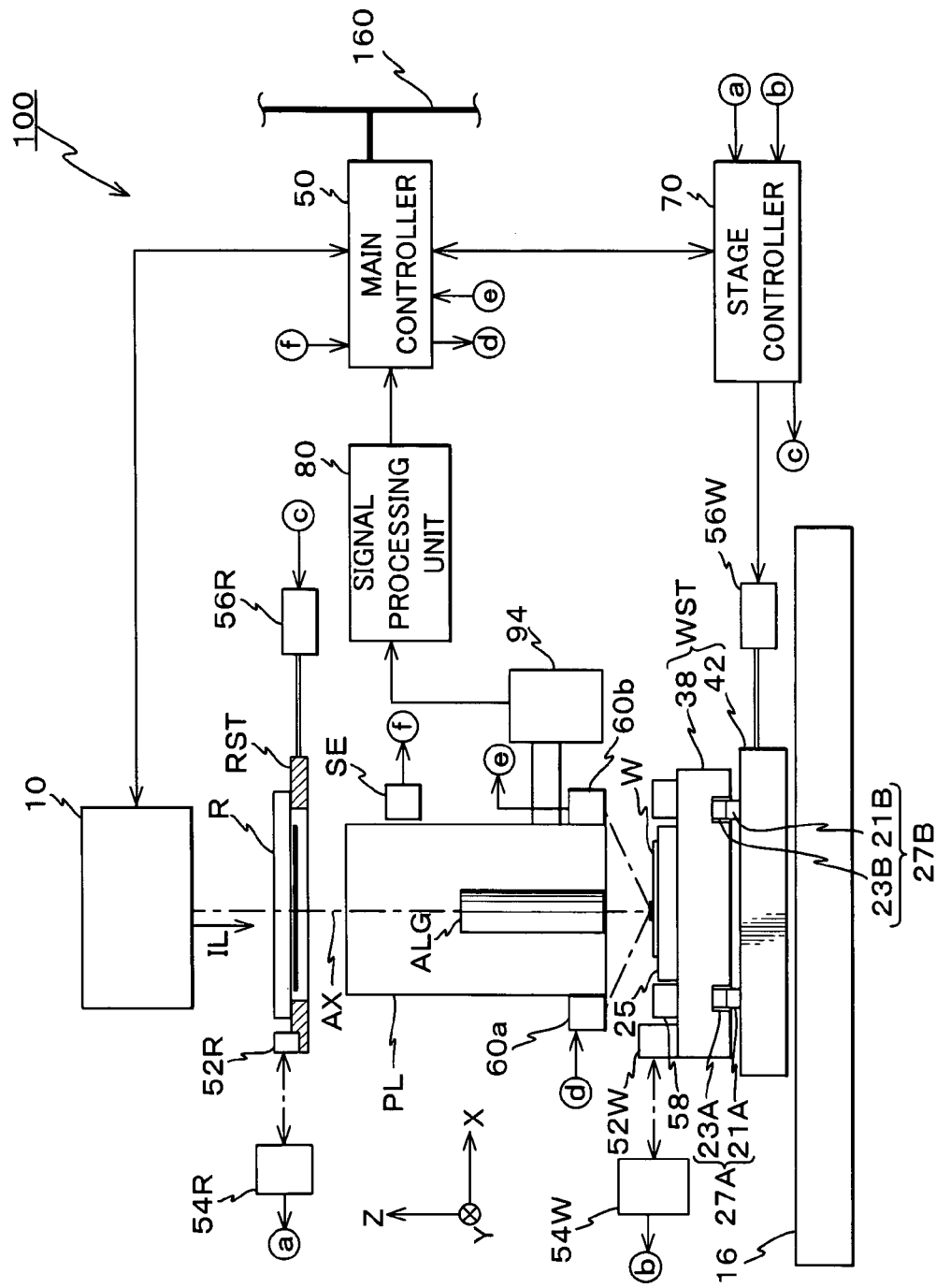
FIG. 2 is a view showing a schematic configuration of an exposure apparatus in FIG. 1.

FIG. 2 shows the schematic configuration of exposure apparatus 100. Exposure apparatus 100 is equipped with an illumination system 10 including a light source, a reticle stage RST on which a reticle R is mounted, a projection optical system PL, a wafer stage WST on which a wafer W as an object is mounted, a control system that has overall control over the entire apparatus, and the like. Further, of the component sections stated above, in actual the sections except for a part of the light source and the control system are housed in an environmental control chamber (an environmental chamber) (not shown) in which environmental conditions such as the temperature and the pressure are maintained to a substantially constant level.

Illumination system 10 is, for example, as disclosed in Kokai (Japanese Unexamined Patent Application Publication) No. 06-349701 and the corresponding U.S. Pat. No. 5,534,970 and the like, configured containing a light source and an illumination optical system, irradiates an illumination light IL as an exposure light to a rectangular-shaped or a circular-arc-shaped illumination area that is set by an aperture stop (also referred to as a masking blade, or a reticle blind) arranged inside, and illuminates reticle R on which a circuit pattern is formed with uniform illuminance. In this case, as the light source, an ArF excimer laser that outputs (emits) a pulsed laser light in a vacuum ultraviolet region having a wavelength of 193 nm is used as an example. As long as the national laws in designated states (or elected states), to which this international application is applied, permit, the above disclosures of the publication and the U.S. patent are incorporated herein by reference.

On reticle stage RST, reticle R on a pattern surface (a lower surface in FIG. 2) of which a circuit pattern or the like is formed is mounted and fixed by, for example, vacuum suction (or electrostatic suction). Reticle stage RST has a structure finely drivable two-dimensionally within an XY plane (an X-axis direction, a Y-axis direction orthogonal to the X-axis direction, and a rotation direction around a Z-axis direction orthogonal to the XY plane (a θz direction)) by a reticle stage drive system 56R including, for example, a linear motor and the like, and is also drivable on a reticle base (not shown) at a designated scanning velocity in a predetermined scanning direction (to be the Y-axis direction that is a direction orthogonal to the page surface in FIG. 2, in this case).

On reticle stage RST, a movable mirror 52R is fixed, and the position of reticle stage RST within the XY plane is constantly detected at a resolution of, for example, around 0.5 to 1 nm with a reticle laser interferometer (hereinafter referred to as a 'reticle interferometer') 54R via movable mirror 52R. In this case, in actual, a Y movable mirror having a reflection surface orthogonal to a scanning direction (the Y-axis direction) and an X movable mirror having a reflection surface orthogonal to a non-scanning direction (the X-axis direction) are arranged on reticle stage RST, and a reticle Y interferometer and a reticle X interferometer are arranged corresponding to these movable mirrors. However, in FIG. 2, they are represented by movable mirror 52R and reticle interferometer 54R. Incidentally, for example, an end surface of reticle stage RST may be polished in order to form a reflection surface (corresponding to a reflection surface of the X movable mirror and the Y-movable mirror described above). Further, at least one corner cubic mirror (such as a retroreflector) may be used, instead of a reflection surface extending in the X-axis direction that is used to detect the position of reticle stage RST in the scanning direction (the Y-axis direction in the embodiment). In this case, one of the reticle Y interferometer and the reticle X interferometer, for example, the reticle Y interferometer is a double-axis interferometer that has two measurement axes, and besides the Y-position of reticle stage RST, a rotation in the $\theta z$ direction can be measured based on the measurement value of the reticle Y interferometer.

Position information (or velocity information) of reticle stage RST from reticle interferometer 54R is sent to a stage controller 70 and a main controller 50 via stage controller 70. Stage controller 70 controls the movement of reticle stage RST via reticle stage drive system 56R based on instructions of main controller 50.

Projection optical system PL has a direction of an optical axis AX in the Z-axis direction, and is arranged below reticle stage RST in FIG. 2. As projection optical system PL, in this case, a dioptric system that is a both-side telecentric reduction system, and includes a plurality of lens elements arranged at predetermined intervals along optical axis AX is used. The projection magnification of projection optical system PL is, for example, $\frac{1}{4}$, $\frac{1}{5}$ or the like. Therefore, when illumination light IL from illumination system 10 illuminates a slit-shaped or circular-arc-shaped illumination area (set by the reticle blind described earlier) extending in the X-axis direction on reticle R, illumination light IL that has passed through reticle R forms a reduced image (a partial inverted image) of the circuit pattern within the illumination area on a projection area (hereinafter, also referred to as an 'exposure area') of illumination light IL, which is conjugate with the illumination area, on wafer W whose surface is coated with a photoresist (photosensitive agent), via projection optical system PL.

Wafer stage WST includes an XY stage 42 and a Z tilt stage 38 that is mounted on XY stage 42.

XY stage 42 is supported by levitation, for example, via a clearance of around several μm above the upper surface of a wafer stage base 16 by an air bearing (not shown), and is configured two-dimensionally drivable in the Y-axis direction serving as the scanning direction (the direction orthogonal to the page surface in FIG. 2) and the X-axis direction orthogonal to the Y-axis direction (a horizontal direction of the page surface in FIG. 2) by a linear motor or the like (not shown) that constitutes a wafer stage drive system 56W.

Z tilt stage 38 is supported at three points on XY stage 42 by three Z position drive systems 27A, 27B and 27C (however, Z position drive system 27C in the depth of the page surface is not shown). Z position drive systems 27A to 27C include three actuators (such as voice coil motors) 21A, 21B and 21C (however, actuator 21C in the depth of the page surface is not shown) that independently drive each supporting point arranged at the lower surface of Z tilt stage 38 in the optical axis direction (the Z-axis direction) of projection optical system PL, and encoders 23A, 23B and 23C (however, encoder 23C in the depth of the page surface is not shown) that respectively detect a drive amount (a displacement from a datum position) in the Z-axis direction of each supporting point driven by each of actuators 21A, 21B and 21C. In this case, as encoders 23A to 23C, for example, a linear encoder based on an optical method, a capacitance method or the like can be used. In the embodiment, a drive unit is configured including actuators 21A to 21C that drives Z tilt stage 38 in the optical axis AX direction (the Z-direction) and the oblique directions with respect to a plane (XY plane) orthogonal to the optical axis, that is, the $\theta x$ direction that is a rotation direction around the X-axis and the $\theta y$ direction that is a rotation direction around the Y-axis. Further, the drive amount (the displacement amount from the datum point) in the Z-axis direction of each supporting point driven by Z position drive systems 27A to 27C of Z tilt stage 38 that is measured by encoders 23A to 23C is supplied to stage controller 70 and main controller 50 via stage controller 70.

On Z tilt stage 38, a movable mirror 52W is fixed, and the position of Z tilt stage 38 (wafer stage WST) within the XY plane is constantly detected at a resolution of, for example, around 0.5 to 1 nm with a wafer laser interferometer (hereinafter referred to as a 'wafer interferometer') 54W, which is arranged outside, via movable mirror 52W.

In actual, on Z tilt stage 38, a Y movable mirror having a reflection surface orthogonal to the Y-axis direction serving as a scanning direction when performing scanning exposure and an X movable mirror having a reflection surface orthogonal to the X-axis direction serving as a non-scanning direction are arranged, and as the wafer interferometer, an X laser interferometer for X-axis direction position measurement and a Y laser interferometer for Y-axis direction position measurement are arranged corresponding to the X and Y movable mirrors. However, in FIG. 2, they are represented by movable mirror 52W and wafer interferometer 54W. Incidentally, for example, an end surface of Z tilt stage 38 may be polished in order to form a reflection surface (corresponding to a reflection surface of the X movable mirror and Y movable mirror described above). Further, the X laser interferometer and the Y laser interferometer are multi-axis interferometers that have a plurality of measurement axes, and with these interferometers, besides the X and Y positions of wafer stage WST, rotation (yawing ($\theta z$ rotation being the rotation around the Z axis)), pitching ($\theta x$ rotation being the rotation around the X axis) and rolling ($\theta y$ rotation being the rotation around the Y axis) can also be measured. Accordingly, in the following description, the position of Z tilt stage 38 in directions of five degrees of freedom, i.e. the X, Y, $\theta z$, $\theta y$ and $\theta x$ directions is to be measured by wafer interferometer 54W. Further, the multi-axis interferometer irradiates a laser beam to a reflection surface arranged on a frame (not shown) on which projection optical system PL is mounted via a reflection surface arranged on Z tilt stage 38 at an inclination of 45 degrees, and may detect relative position information related to the optical axis direction (the Z-axis direction) of projection optical system PL.

Position information (or velocity information) of wafer stage WST is supplied to stage controller 70 and to main controller 50 via stage controller 70. According to instructions of main controller 50, stage controller 70 controls the position of wafer stage WST in the XY plane via wafer stage drive system 56W.

On Z tilt stage 38, a wafer holder 25 is arranged, on which wafer W is mounted and fixed by vacuum suction (or electrostatic suction) by wafer holder 25.

Figure 3:
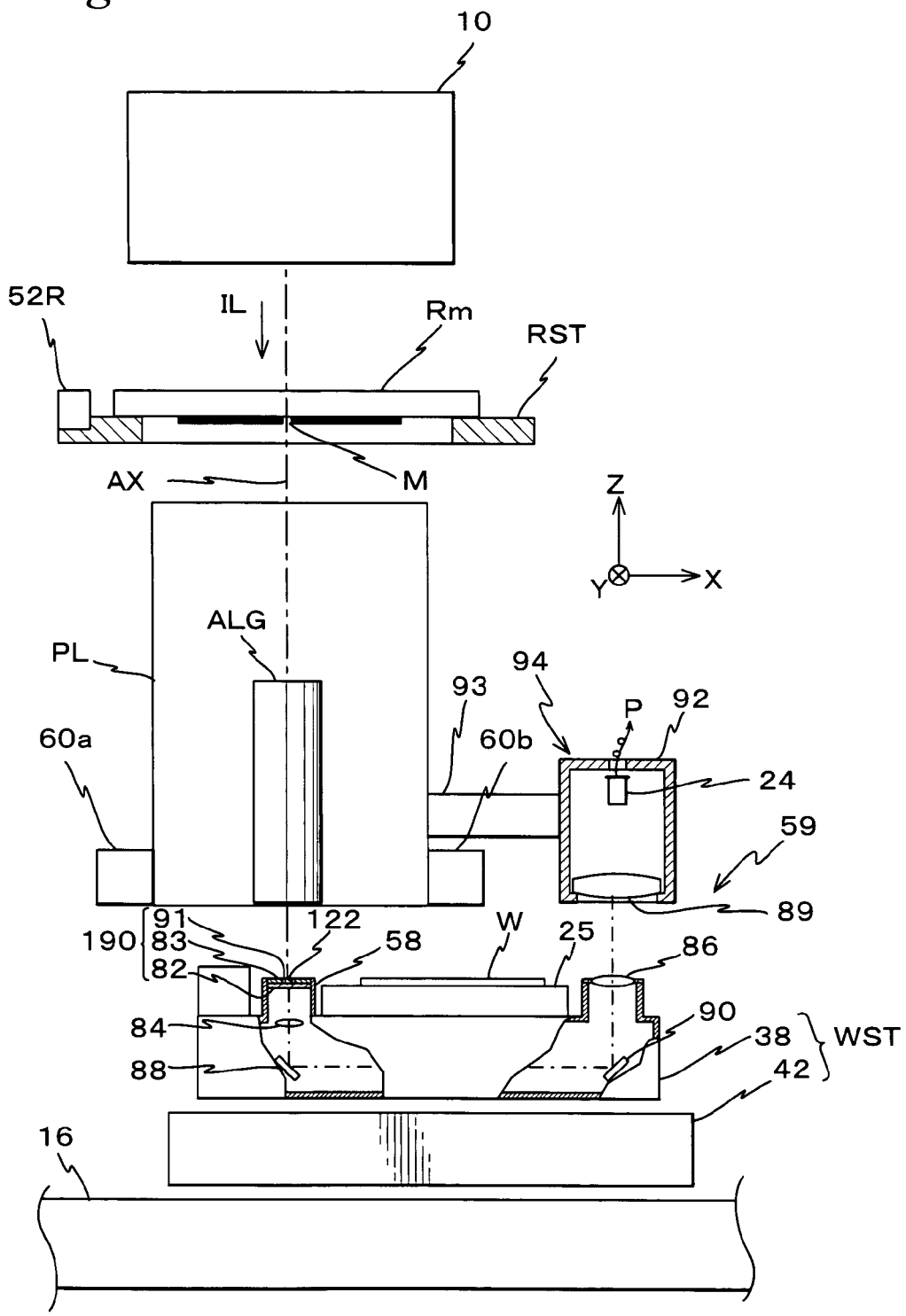
FIG. 3 is a view showing a configuration of an aerial image measurement unit in FIG. 2.

Inside Z tilt stage 38, as is shown in FIG. 3, a part of an optical system that constitutes an aerial image measurement unit 59 used for measurement of optical properties of projection optical system PL is arranged. Next, the configuration of aerial image measurement unit 59 will be described in detail.

Aerial image measurement unit 59 is equipped with an inside-stage section that is arranged in Z tilt stage 38, that is, a slit plate 190 serving as a pattern plate, a lens 84, mirrors 88 and 90 for deflecting the optical path, and light transmitting lens 86, and an outside-stage section that is arranged outside wafer stage WST, that is, a photodetection lens 89, an optical sensor 24 made up of a photoelectric conversion element, and the like.

To be more specific, as is shown in FIG. 3, slit plate 190 is fixed to a protruding section 58 that has a cylindrical shape and arranged on the upper surface of Z tilt stage 38, in a state of closing an opening in an upper portion of protruding section 58. The upper surface of slit plate 190 is to be in a state of substantially coplanar (flush) with a surface of wafer W that is sucked on wafer holder 25 described above. Slit plat 190 has a photodetection glass 82, reflection film 83 and a light shielding film 91. Photodetection glass 82 has a circular-shape and made of synthetic quartz, fluorite or the like having high transmittance to illumination light IL that has a wavelength of 193 nm, reflection film 83 that also serves as a light shielding film is composed of a thin film made of metals such as aluminum and formed on a portion excluding a circular area in the center portion on the upper surface of photodetection glass 82, and light shielding film 91 is composed of a thin film made of chromium and formed in the circular area.

As an example, reflection film 83 is substantially rectangular shaped having the length of 50 mm in the Y-axis direction and the length of 30 mm in the X-axis direction, and a diameter of light shielding film 91 in the center is, for example, about 4.5 mm. On light shielding film 91, a slit-shaped aperture pattern 122 having a predetermined width, for example, 0.2 µm, extending in the Y-axis direction is formed by patterning.

Inside Z tilt stage 38 below slit plate 190, as is shown in FIG. 3, lens 84 and optical path deflecting mirror 88 are sequentially arranged below aperture pattern 122. Deflecting mirror 88 is arranged at an inclination of 45 degrees. Therefore, illumination light IL (an image beam) that is incident vertically downward (a −Z direction) via aperture pattern 122 and photodetection glass 82 passes through lens 84 and the optical path of the illumination light is deflected by deflecting mirror 88 by 90 degrees toward a +X direction. In the rear of the optical path of illumination light IL that is deflected by deflecting mirror 88, mirror 90 that further deflects the optical path by 90 degrees vertically upward (a +Z direction) is arranged, and light transmitting lens 86 that sends illumination light IL outside Z tilt stage 38 is fixed to the upper wall portion of Z tilt stage 38, which is located in the rear of the optical path of illumination light IL deflected by mirror 90.

In the optical path of illumination light IL that is sent to the outside of Z tilt stage 38 by light transmitting lens 86, photodetection lens 89 that has a larger diameter compared to light transmitting lens 86 is arranged. In the position above photodetection lens 89, optical sensor 24 is arranged. Photodetection lens 89 and optical sensor 24 are housed in a case 92 while maintaining a predetermined positional relation, and case 92 is fixed to a side surface of a barrel of projection optical system PL via an attachment member 93. A photodetector 94 is configured including photodetection lens 89, optical sensor 24 and case 92.

As optical sensor 24, a photoelectric conversion element (a photodetection element) that can detect faint light with good accuracy, for example, a photomultiplier tube (PMT, a photoelectron doubling tube) or the like is used. An output signal of optical sensor 24 is sent to a signal processing unit 80 shown in FIG. 2. Signal processing unit 80 includes, for example, an amplifier, an A/D converter (normally, the converter with 16-bit resolution is used) and the like. The output from signal processing unit 80 is sent to main controller 50.

With aerial image measurement unit 59 configured as described above, for example, when measuring a projected image (i.e. an aerial image) projected by projection optical system PL of a measurement mark formed on a measurement reticle (or a mark plate on reticle stage RST) or the like, slit plate 190 is illuminated with illumination light IL that has passed through projection optical system PL, and illumination light IL passing through aperture pattern 122 on slit plate 190 is guided to the outside of Z tilt stage 38 via lens 84, mirrors 88 and 90 and light transmitting lens 86. Then, the light guided outside Z tilt stage 38 is received by photodetector 94 (to be more accurate, by optical sensor 24), and a photoelectric conversion signal (a light amount signal) P in accordance with the photodetection amount is supplied from optical sensor 24 of photodetector 94 to signal processing unit 80.

In the embodiment, on the measurement of an aerial image described above, slit plate 190 needs to cross the aerial image, and when slit plate 190 crosses the aerial image, light transmitting lens 86 moves with respect to photodetector 94. Accordingly, in aerial image measurement unit 59, a size of each lens and mirror is set so that all the illumination lights from light transmitting lens 86 that moves in a predetermined range enter photodetector 94.

Since aerial image measurement unit 59 is configured as described above, measurement accuracy of wafer interferometer 54W or the like is not adversely affected due to heat generation of optical sensor 24. Further, because the outside section and the inside section of Z tilt stage 38 are not connected by light guide or the like, drive accuracy of Z tilt stage 38 is not adversely affected as in the case where the outside section and the inside section of Z tilt stage 38 are connected by light guide. As a matter of course, in the case the influence of heat can be eliminated, optical sensor 24 may be arranged inside Z tilt stage 38.

Referring back to FIG. 2, on a side surface of projection optical system PL, an off-axis alignment system ALG that detects an alignment mark (a positioning mark) on wafer W or a fiducial mark on a fiducial mark plate (not shown) is arranged. In the embodiment, as alignment system ALG, an alignment sensor based on the so-called FIA (Field Image Alignment) system image processing method is used that includes a light source for alignment (such as a halogen lamp emitting a broadband illumination light), an optical system, an index plate on which an index mark is formed, an imaging device (CCD), and the like. An imaging signal from alignment system ALG is sent to an alignment controller (not shown), and the alignment controller outputs position information of the alignment mark (or the fiducial mark) with respect to a detection center of the alignment system (corresponding to the center of the index mark described above) to main controller 50. Main controller 50 computes a position coordinate of the alignment mark (or the fiducial mark) on a stage coordinate system that is set by the measurement axes of wafer interferometer 54W based on the position information and position information of wafer stage WST that is the output of wafer interferometer 54W at this point of time.

In the vicinity of projection optical system PL, a sensor unit SE, which includes a plurality of sensors that measure environmental conditions within the environmental control chamber (not shown) such as the temperature, the pressure (the pressure of the gas in the chamber (the atmospheric pressure, in the case the inside gas is air)) and the humidity, is arranged. A measurement value of each sensor constituting sensor unit SE is supplied to main controller 50. Main controller 50 controls an air-conditioner (not shown) based on temperature information from sensor unit SE, and maintains the temperature within the environmental control chamber to a predetermined set temperature or ±0.1° C. from the predetermined set temperature. Further, humidity information and pressure information from sensor unit SE are constantly monitored by main controller 50.

Further, in exposure apparatus 100, as is shown in FIG. 2, a multiple focal point position detection system (60a, 60b) by an oblique incident method, which serves as a measurement unit that includes an irradiation system 60a and a photodetection system 60b and measures the position of wafer W in the optical axis AX direction, is arranged. Irradiation system 60a has a light source which on/off is controlled by main controller 50, and irradiates image-forming beams for forming multiple images of slits or pinholes toward an image-forming plane of projection optical system PL to a surface of wafer W from an oblique direction with respect to optical axis AX. Photodetection system 60b receives the reflected beams generated by the image-forming beams reflecting off the surface of wafer W, and sends a focal point deviation signal (a defocus signal) used to detect a focal point deviation, for example, an S curve signal to main controller 50. The detailed configuration of a multiple focal point position detection system similar to the multiple focal point position detection system (60a, 60b) is disclosed in, for example, Kokai (Japanese Unexamined Patent Application Publication) No. 06-283403, and the corresponding U.S. Pat. No. 5,448,332, and the like. As long as the national laws in designated states (or elected states), to which this international application is applied, permit, the above disclosures of the publication and the corresponding U.S. patent are incorporated herein by reference.

Furthermore, in exposure apparatus 100 of the embodiment, above reticle R, a pair of reticle alignment detection systems are arranged a predetermined distance apart in the X-axis direction, though they are omitted in FIG. 1. The pair of reticle alignment detection systems is composed of a TTR (Through the Reticle) alignment system that uses a light with an exposure wavelength for simultaneously observing a reticle mark on reticle R and a fiducial mark corresponding to the reticle mark via projection optical system PL. As the reticle alignment detection systems, the configuration similar to the one disclosed in, for example, Kokai (Japanese Unexamined Patent Application Publication) No. 07-176468, and the corresponding U.S. Pat. No. 5,646,413, and the like is used. As long as the national laws in designated states (or elected states), to which this international application is applied, permit, the above disclosures of the publication and the corresponding U.S. patent are incorporated herein by reference.

The control system is mainly configured with main controller 50 that is made up of a workstation (or a microcomputer), and includes stage controller 70 under the control of main controller 50, signal processing unit 80, and the like. Main controller 50 performs overall control over the respective components of the exposure apparatus including the microcomputer or the workstation. Main controller 50 connects to LAN160 described earlier.

In exposure apparatus 100 configured as described above, reticle alignment, baseline measurement of alignment system ALG, wafer alignment (such as EGA) and the exposure operations by a step-and-scan method are performed, under the control of host computer 150. Since theses operations are not different from those in a normal scanning stepper, the detailed description is omitted here.

Next, a measurement method of a best focus position of projection optical system PL will be described, which measurement is performed in exposure apparatus 100 according to instructions from control server 130 when performing a primitive maintenance or the like to be described later.

First, main controller 50 loads a predetermined measurement reticle Rm (refer to FIG. 3) on reticle stage RST via a reticle loader (not shown). On a pattern surface of measurement reticle Rm, a predetermined pattern area is formed, and a predetermined mark area is arranged at a plurality of points, for example, 9 points within a rectangular-shaped area having the substantially same shape as the illumination area described earlier, in the center of the pattern area. In this case, the mark area is formed at 9 points in total, which are the center of the rectangular-shaped area, the positions at four corners and the positions at midpoints of four sides, and a measurement mark M (refer to FIG. 3) that has a periodic direction in the X-axis direction and is made up of, for example, a line-and-space pattern having a line width of 0.2 μm is to be arranged within each mark area.

Next, main controller 50 adjusts the position of reticle stage RST via stage controller 70 so that the position of a predetermined measurement mark M on measurement reticle Rm, in this case, the position of measurement mark M in the center is set at a predetermined measurement point (to be the field center of projection optical system PL, that is, the measurement point in the optical axis, in this case) at which the best focus position is measured within the field of projection optical system PL. The position adjustment of reticle stage RST is performed, for example, based on detection results obtained by simultaneously detecting a pair of reticle alignment marks, which are formed respectively at positions symmetrically arranged with respect to a linear reticle center in the non-scanning direction that passes through the center (the reticle center) of the pattern area on measurement reticle Rm, using the pair of reticle alignment detection systems described earlier.

Next, main controller 50 drives and controls the reticle blind within illumination system 10 and sets (restricts) the illumination area so that illumination light IL is irradiated only to a portion of measurement mark M described above (a portion of chromium layer where the measurement mark M is formed).

Next, in order for a height position of a surface of slit plate 190, that is, the position in the Z-axis direction (hereinafter shorted to a 'Z position') to be a predetermined initial position, the Z position of Z tilt stage 38 is adjusted via stage controller 70. As the 'initial position' in this case, for example, the Z position of default setting in which the measurement values of encoders 23A to 23C become the values set in advance is employed.

Next, the aerial image measurement of measurement mark M by horizontal direction scanning is performed. Specifically, while illuminating illumination light IL from illumination system 10 to measurement mark M on measurement reticle Rm arranged on reticle stage RST, wafer stage WST (Z tilt stage 38) is scanned and driven in the X-axis direction via stage controller 70 and wafer stage drive system 56W so that in the vicinity of an image plane of projection optical system PL, aperture pattern 122 of slit plate 190 is scanned in a predetermined measurement direction (in this case, in the X-axis direction) with respect to a projected image of measurement mark M by projection optical system PL. Then, by simultaneously loading an output signal from optical sensor 24 that is inputted via signal processing unit 80 during the scanning drive and information on the position in the X-axis direction (the X position) of Z tilt stage 38 that is inputted via stage controller 70, at predetermined sampling intervals, an intensity signal (an aerial image profile) of the projected image (the aerial image) of measurement mark M is obtained (that is, the measurement of the aerial image is performed).

Next, main controller 50 changes the Z position of slit plate 190 via Z tilt stage 38 according to the change procedures set in advance while measuring the Z position of Z tilt stage 38 using the multiple focal point position detection system (60a, 60b), and performs the aerial image measurement of measurement mark M by horizontal direction scanning with respect to each Z position.

Incidentally, the change in the Z position of slit plate 190 described above can be performed in the following procedures. That is, on the first change, the Z position can move to a position Δz distant apart from the initial position in the +Z direction; on the second change, moves to a position Δz distant apart from the initial position in the −Z direction; on the third change, moves to a position 2×Δz distant apart from the initial position in the +Z direction; on the fourth change, moves to a position 2×Δz distant apart from the initial position in the −Z direction, and on the subsequent changes, moves to positions 3×Δz distant apart in the +Z direction and 3×Δz distant apart in the −Z direction Further, in the case it can be judged that the best focus position exists in either of the +Z direction or the −Z direction from the initial position based on the results of the horizontal direction scanning, the Z position can move by Δz (Δz, 2×Δz, 3×Δz . . . ) in either of the +Z direction or the −Z direction from the initial position as the center. Incidentally, Δz is set to, for example, a value of around 0.05 μm to 0.30 μm.

Then, with respect to each of the intensity signals of the aerial images at respective Z positions in predetermined steps (for example, 13 or 15 steps) obtained as described above, the contrast is computed, and based on the computation results, a contrast curve (the lateral axis is to indicate the Z position) is obtained, and then the Z position corresponding to the peak position of the contrast curve is computed as the best focus position.

Next, the control method in which the performances of exposure apparatus 100 is controlled, which is performed in lithography system 300 of the embodiment, will be described, having reference to the focus that is a kind of the image-forming performances of projection optical system PL.

Figure 4:
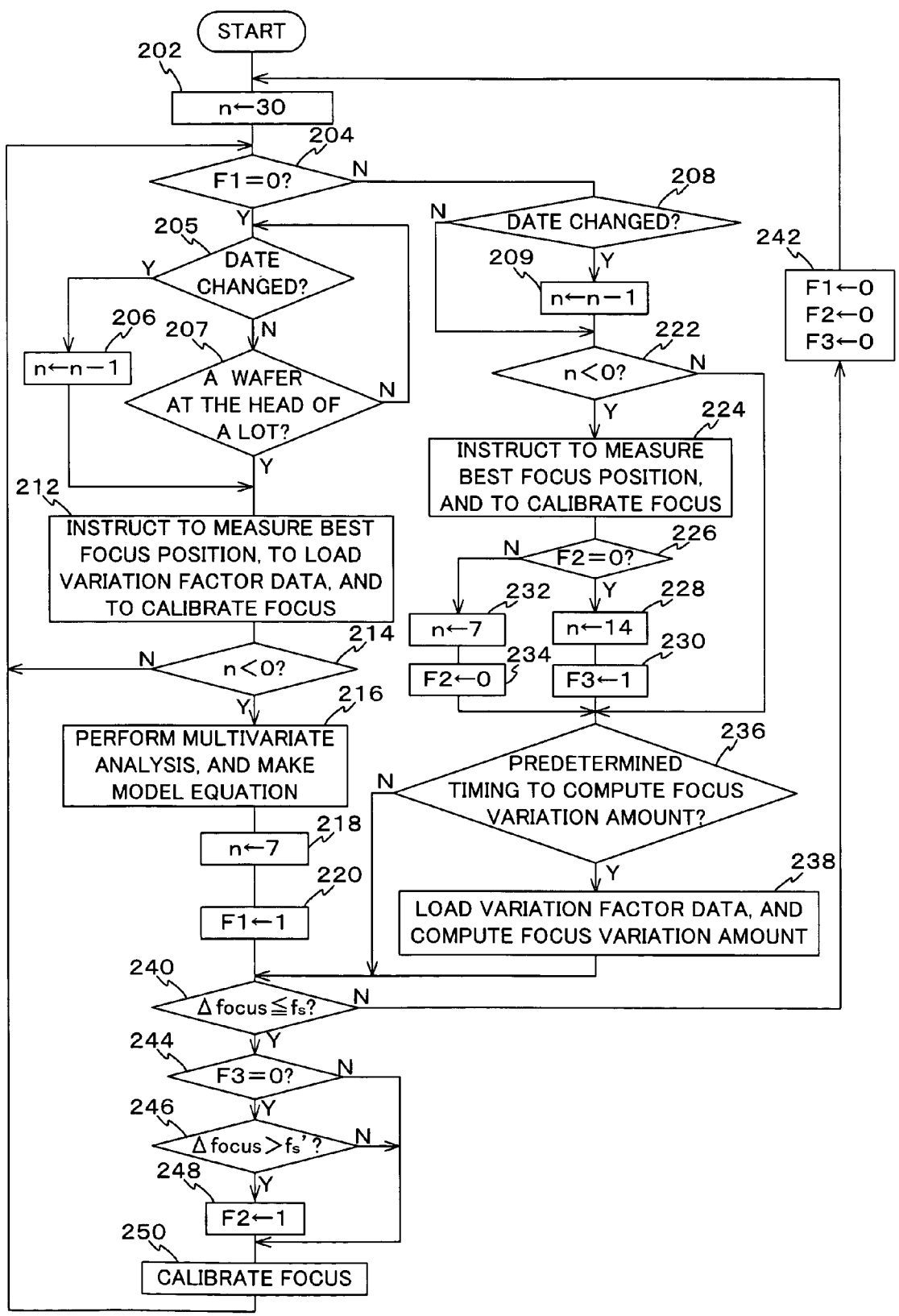
FIG. 4 is a flowchart corresponding to a program that is executed by a CPU inside a control server.

FIG. 4 shows the flowchart that corresponds to a program (a processing algorithm) executed by the CPU inside control server 130. The flowchart starts when exposure apparatus 100 is delivered to a semiconductor factory, the in-line connection with C/D 110, overlay measurement unit 120 and the like, and the online connection with control server 130, host computer 150 and the like via LAN160 are completed, predetermined preparatory operations for operating exposure apparatus 100 end, and exposure apparatus 100 is completely under the control of host computer 150. Thus, according to instructions from host computer 150, exposure apparatus 100 is in a normal operational state.

As a premise, all of flags F1, F2 and F3, which will be described later, are to be in a reset state (to be F1=0, F2=0, F3=0).

First in step 202, '30' (which represents one month, i.e. 30 days) is set to a counter value 'n' of a predetermined counter as an initial value.

In the next step, step 204, the judgment is made of whether or not flag F1 described above is in a reset state (flag 1 is lowered), that is, F1 equals '0' (F1=0). Incidentally, flag 1 indicates whether a model equation used to estimate a focus variation amount to be described later has been computed or not, and when the model equation has been computed, flag F1 is in a set state (F1=1), and when the model equation has not been computed, flag F1 is in a lowered state (F1=0). In this case, flag F1=0 is set as an initial state and the model equation has not been computed, and therefore, the judgment here is affirmed, and the procedure proceeds to step 205.

In step 205, the judgment is made of whether of not the date has changed, based on an internal clock. Then, when the judgment is denied, the procedure shifts to step 207, and when the judgment is affirmed, the procedure proceeds to step 206.

In step 207, the communication is performed with main controller 50 of exposure apparatus 100, and the judgment is made of whether or not an exposure subject of exposure apparatus 100 is a first wafer of a lot (a wafer at the head of a lot). Then, the judgment is denied, the procedure returns to step 205. The judgment in step 205 is denied unless the date is changed. In other words, by repeating a loop processing of steps 207→205→207, the procedure waits for the exposure subject of exposure apparatus 100 to become a first wafer of a lot (a wafer at the head of a lot). Then, when the exposure subject of exposure apparatus 100 becomes a first wafer of a lot, the judgment in step 207 is affirmed, and the procedure proceeds to step 212.

In step 212, main controller 50 of exposure apparatus 100 is instructed to perform primitive maintenance (hereinafter shortened to 'PM') that includes measurement of a best focus position, loading of variation factor data of the best focus position, and calibration of focus based on the measurement results of the best focus position.

In response to the above instructions, main controller 50 of exposure apparatus 100 performs PM, and as a part of PM, the measurement of the best focus position using the aerial image measurement unit described earlier is performed.

Further, main controller 50 of exposure apparatus 100 takes in the measurement values of the temperature, the pressure (the atmospheric pressure) and the humidity from sensor unit SE during the measurement of the best focus position described above, at predetermined sampling intervals. Then, at the time of completing the measurement (the computation) of the best focus position described above, a mean value of the measurement values of the temperature, the pressure and the humidity is sent to control server 130 along with data on the best focus position. With this operation, control server 130 registers information that has been sent, in a database (herein after referred to as a 'prediction algorithm database') inside the large capacity storage.

Furthermore, main controller 50 of exposure apparatus 100 performs the focus calibration based on the measurement results of the best focus position described above. In the case of the embodiment, the focus calibration means calibration of the multiple focal point position detection system (60a, 60b), that is, adjustment of an origin or a change in an offset of a detection origin. The reason is as follows.

That is, when initial adjustment is assumed to be performed to the multiple focal point position detection system (60a, 60b) in a start-up stage of exposure apparatus 100 so that a detection origin of the multiple focal point position detection system (60a, 60b) accurately coincides with an initial best focus position of projection optical system PL, the value obtained as the measurement results of the best focus position described above is exactly an offset of the detection origin of the multiple focal point position detection system (60a, 60b) with respect to the real best focus position of projection optical system PL.

The offset of the detection origin of the multiple focal point position detection system (60a, 60b) with respect to the real best focus position of projection optical system PL described above is a sum of a first offset component (including zero) caused by a change in a state of the multiple focal point position detections system itself and a second offset component (including zero) caused by a variation in the best focus position of projection optical system PL.

In the next step, step 214, the judgment is made of whether or not count value 'n' of the counter is smaller than zero. In this case, since 'n' is set to equal 30 (n=30) in step 202 described above, the judgment in step 214 is denied and the procedure returns to step 204. Afterward, unless the date changes, a loop processing of steps 204→205→207 and a loop processing of steps 212→214→204 are repeated. With this operation, each time just before starting exposure of a wafer at the head of a lot, measurement data on the best focus position and the mean value of the temperature, the pressure and the humidity during the measurement are obtained in exposure apparatus 100 and sent to control server 130, and accordingly control server 130 stores them into the prediction algorithm database described earlier.

Meanwhile, when it is judged in step 205 that the date changes, the procedure proceeds to step 206, in which count value 'n' of the counter is decremented by one (n←n−1), and then the procedure shifts to step 212 and the processing of step 212 already described is performed.

After that, in the case it is judged that F1 equals zero (F1=0) in step 204, until 30 days lapse from the processing start and the judgment in step 214 is affirmed, a loop processing of steps 204→205→207 and a loop processing of steps 212→214→204 (in the case the date is not changed), or a loop processing of steps 204→205→206→212→214→204 (in the case the date is changed) are/is repeated each time when the date changes or each time just before exposure of a wafer at the head of a lot starts.

With this operation, measurement data on the best focus position obtained each time when the date of 30 days (1 month) is changed or each time when a lot is switched to another lot even in the processing during the same day, and data on the mean value of the temperature, the pressure and the humidity during the measurement corresponding to the measurement data are registered in the prediction algorithm database of control server 130.

Then, when 30 days lapse from the processing start and 'n' becomes −1 (n=−1), the judgment in step 214 is affirmed and the procedure shifts to step 216.

In step 216, based on all data registered in the prediction algorithm database, multivariate analysis (such as multiple regression analysis, single regression analysis, main component/factor analysis, discriminant analysis, or quantification analysis) is performed, and a model equation as expressed in the following equation (1) used to estimate a focus variation amount Δfocus, which includes variation factors (to be temperature T, humidity H, and pressure P within the environmental control chamber, in this case) of the focus (that is, the offset of the detection origin of the multiple focal point position detection system (60a, 60b) with respect to the real best focus position of projection optical system PL) as variables, is made, and also '0' is stored as an initial value of Δfocus in a variation amount storing region within the large capacity storage.

$$\Delta\text{focus} = A + B \times H + C \times P + D \times T \tag{1}$$

In this case, Δfocus is a variation amount per day of the best focus position of projection optical system PL (including a variation amount that is converted into a one-day variation amount) that is detected using the multiple focal point position detection system (60a, 60b) described above.

Incidentally, in the embodiment, a quad-variate linear polynomial is used. On derivation of a focus variation amount prediction equation, partial regression coefficients B, C and D, and a constant term A are computed based on the following equations (2) and (3) respectively, using the least-squares method.

$$\begin{pmatrix} B \\ C \\ D \end{pmatrix} = \begin{pmatrix} S_H^2 & S_{HP} & S_{HT} \\ S_{HP} & S_P^2 & S_{PT} \\ S_{HT} & S_{PT} & S_T^2 \end{pmatrix}^{-1} \begin{pmatrix} S_{H\Delta focus} \\ S_{P\Delta focus} \\ S_{T\Delta focus} \end{pmatrix} \tag{2}$$

$$A = \overline{\Delta\text{focus}} - B\overline{H} - C\overline{P} - D\overline{T} \tag{3}$$

In the above equation (3),
$\overline{\Delta\text{focus}}$ is the mean of focus variation amount data,
$\overline{H}$ is the mean of humidity data,
$\overline{P}$ is the mean of pressure data, and
$\overline{T}$ is the mean of temperature data.
Further, in the above equation (2),
$S_H^2$ is the variance of humidity data,
$S_{HP}$ is the covariance of humidity data and pressure data,
$S_{HT}$ is the covariance of humidity data and temperature data,
$S_P^2$ is the variance of pressure data,
$S_{PT}$ is the covariance of pressure data and temperature data,
$S_T^2$ is the variance of temperature data,
$S_{H\Delta focus}$ is the covariance of humidity data and focus variation amount data,
$S_{P\Delta focus}$ is the covariance of pressure data and focus variation amount data, and
$S_{T\Delta focus}$ is the covariance of temperature data and focus variation amount data.

In addition, besides the quad-variate linear polynomial, the accuracy of the prediction equation may be improved by increasing variation factor data when needed, or increasing the order with respect to each variation factor when needed. Further, as the prediction equation, exponential curve, exponentiation curve or the like may be used.

In the next step, step 218, '7' is set in count value 'n' of the counter (which indicates a week, i.e. 7 days) (n←7), and the procedure proceeds to step 220, in which flag F1 described earlier is set (F1←1), then the procedure shifts to step 240.

In step 240, the judgment is made of whether or not Δfocus stored in the variation amount storing region of the large capacity storage is equal to or smaller than a permissible value (a first threshold value) fs (for example, 0.1 μm/day) that is set in advance. In this case, since '0' is stored in the variation amount storing region of the large capacity storage as the initial value of Δfocus in step 216 described above, the judgment in step 240 is affirmed and the procedure shifts to the next step, step 244.

In step 244, the judgment is made of whether or not flag F3 is in a reset state. In this case, flag F3 is a control flag used to prohibit a PM implementation interval from returning to one week (7 days) in the case the implementation interval has been changed once from one week (7 days) to two weeks (14 days) in step 228, which will be described later, in the case the focus variation amount is equal to or smaller than a second threshold value fs' to be described later. A state where flag F3 is set (a state of F3=1) indicates a state where it is prohibited to compare the focus variation amount with second threshold value fs', which will be described later, and a state where flag F3 is lowered (a state of F3=0) indicates other states. In this case, because flag F3 is in a reset state (a lowered state) as the initial setting, the judgment in step 244 is affirmed and the procedure proceeds to step 246, in which the judgment is made of whether or not Δfocus is larger than second threshold value fs' set in advance (fs'<fs, fs' is, for example, 0.05 μm/day). In this case, because Δfocus equals zero (Δfocus=0), the judgment in step 246 is denied, the procedure proceeds to step 250.

In step 250, after main controller 50 of exposure apparatus 100 is instructed to perform the focus calibration described earlier based the latest Δfocus, the procedure returns to step 204. In this case, Δfocus equals zero (Δfocus=0), the focus calibration is not substantially performed.

After step 220 described above, in step 204, the judgment is made again of whether or not flag F1 equals zero (flag F1=0), and in this case, since flag F1 is set in step 220 described above, the judgment in step 204 is denied and the procedure shifts to step 208.

Then, in step 208, when the date is changed, the procedure proceeds to step 209 and count value 'n' of the counter is decremented by one (n←n−1), then the procedure proceeds to step 222, and when the date is not changed, the procedure proceeds directly to step 222.

In step 222, the judgment is made of whether or not count value 'n' is smaller than zero, and in this case, since 'n' equals 7 (n=7), the judgment in step 222 is denied and the procedure shifts to step 236.

In step 236, the judgment is made of whether or not it is a predetermined timing to perform prediction computation of a focus variation amount (for example, whether a predetermined period of time has lapsed or not, whether a predetermined number of wafers have been processed or not, or the like), based on the internal clock, memory data (data indicating a processing state) or the like. Then, when it is not the predetermined timing, the judgment in step 236 is denied and the procedure shifts to step 240. In step 240, the judgment is made of whether or not Δfocus stored in the variation amount storing region of the large capacity storage is equal to or smaller than threshold value fs. In this case, because Δfocus is still zero, the procedure proceeds to step 244. Since flag F3 equals zero (F3=0) at this point of time, the judgment in step 244 is affirmed and the procedure proceeds to step 246. After the judgment in step 246 is denied and the procedure shifts to step 250, in which main controller 50 of exposure apparatus 100 is instructed to perform the focus calibration described earlier based on the latest Δfocus, the procedure returns to step 204.

Afterward, a loop processing of steps 204→208→(209)→222→236→240→244→246→250→204 is repeated in the same manner described above, until the predetermined timing comes.

Then, when the predetermined timing comes, the judgment in step 236 is affirmed, and the procedure proceeds to step 238.

In step 238, information on the temperature, the pressure and the humidity in the environmental control chamber of exposure apparatus 100, which are measured by sensor unit SE, at the point of time is loaded via LAN160 and main controller 50, and also a focus variation amount Δfocus is computed based on the equation (1) described earlier and is overwritten in the variation amount storing region of the large capacity storage, and then the procedure proceeds to step 240.

In step 240, the judgment is made of whether or not Δfocus≦fs is true, and in this case, Δfocus≦fs' is to be true. Further, in the following description, for the sake of convenience, Δfocus≦fs' is to be true for the time being.

Accordingly, the judgment in step 240 is affirmed and the procedures returns to step 204 via steps 244, 246 and 250 sequentially.

After that, until 'n' becomes −1 (n=−1), a loop processing of steps 204→208→(209)→222→236→240→244→246→250→204 (not at the predetermined timing) or a loop processing of steps 204→208→(209)→222→236→238→240→244→246→250→204 (at the predetermined timing) is repeated. With this operation, estimation computation of a focus variation amount is performed at each predetermined timing (with respect to each wafer, or at each predetermined interval) in step 238 using the model equation and the focus calibration is performed based on the estimated focus variation amount Δfocus, for 7 days (one week) from the making of the model equation in step 216 described earlier.

Meanwhile, when 7 days lapse from the making of the model equation and the judgment in step 222 is affirmed, the procedure proceeds to step 224, in which main controller 50 of exposure apparatus 100 is instructed to perform the same PM as in step 212 described earlier. However, the instructions of PM in step 224 include the instructions of measurement of a best focus position and the focus calibration based on the measurement results of the best focus position, but do not include the instruction to load the variation factor data. With this operation, in exposure apparatus 100 the measurement of the best focus position and the focus calibration (the calibration of the multiple focal point position detection system (60a, 60b)) based on the measurement results are executed by main controller 50.

In the next step, step 226, the judgment is made of whether or not flag F2 is in a reset state (F2=0). Flag F2 is a flag used to determine whether a PM implementation interval is set to one week or two weeks when a focus variation amount is equal to or smaller than first threshold value (permissible value) fs. A state where flag F2 is set (F2=1) indicates that a focus variation amount is equal to or smaller than first threshold value (permissible value) fs and larger than second threshold value fs' (a state where the PM implementation interval should be set to one week), and a state where flag F2 is lowered (F2=0) indicates that a focus variation amount is equal to or smaller than second threshold value fs' (a state where the PM implementation interval should be set to two weeks). In this case, since flag F2 still equals 0 (F2=0) as initialized, the judgment here is affirmed and the procedure proceeds to the next step, step 228. After '14' is set as count value 'n' of the counter, the procedure proceeds to step 230. with this operation, the interval up to which PM (the processing of step 224) is performed next is set to two weeks (14 days).

In step 230, flag F3 is set (F3←1) and the procedure shifts to step 236, in which the judgment is made of whether or not it is the predetermined timing described earlier. In the case it is not the predetermined timing, the procedure shifts to step 240. In this case, since Δfocus is equal to or smaller than threshold value fs', the judgment in step 240 is affirmed and the procedure proceeds to step 244.

However, since flag F3 has been set in step 230 described above, the judgment in step 244 is denied, and after the focus calibration is instructed in step 250, the procedure returns to step 204.

After that, until the predetermined timing comes, a loop processing of steps 204→208→(209)→222→236→240→244→250→204 is repeated.

Then, when the predetermined timing comes, the procedure proceeds from step 236 to step 238.

As is described earlier, after computing a focus variation amount Δfocus and overwriting it in the variation amount storing region inside the large capacity storage in step 238, the procedure shifts to step 240.

Then, in this case, because Δfocus≦fs' is assumed to be true, the judgment in step 240 is affirmed and the procedure returns to step 204 via steps 244 and 250.

Afterward, until 'n' becomes −1 (n=−1), a processing of step 204 and the succeeding steps is repeated. With this operation, estimation computation of a focus variation amount is performed at each predetermined timing described earlier in step 238 using the model equation described earlier and the focus calibration is performed based on the estimated focus variation amount for 14 days (two weeks) from the measurement of the best focus position in step 224 described above.

Also after that, as long as the condition of Δfocus≦fs' is met, the above processing is repeatedly performed and estimation computation of a focus variation amount is performed at each predetermined timing in step 238 using the model equation described earlier and the focus calibration is performed based on the estimated focus variation amount for 14 days (two weeks) from the measurement of the best focus position in step 224 described above.

Meanwhile, in the case the focus variation amount Δfocus computed in step 238 falls within a range of fs'<Δfocus≦fs at any point of time during one week after making the model equation in step 216 described earlier, the judgment in step 246 is affirmed and the procedure proceeds to step 248, in which flag F2 is set (F2←1), and the procedure returns to step 204 via step 250.

Accordingly, after that, in the case the judgment in step 222 is affirmed and the instructions of PM in step 224 is issued, the procedure proceeds to step 226, in which the judgment is denied, and the procedure shifts to step 232.

After '7' is set to count value 'n' of the counter in step 232, the procedure proceeds to step 234, in which flag F2 is made to be in a reset state (F2←0), then the processing of step 236 and the succeeding steps is performed as described earlier. With this operation, the interval up to which PM (the processing of step 224) is performed next is set to one week (7 days).

Further, in the case the focus variation amount Δfocus computed in step 238 exceeds threshold value fs at any point of time after making the model equation in step 216 described earlier, the judgment in step 240 is denied and the procedure shifts to step 242, in which all flags F1, F2 and F3 are made to be in a reset state, then the procedure returns to step 202. Afterward, the processing described earlier is repeatedly performed.

As is obvious from the description so far, in the embodiment, a data obtaining unit, a measurement executing unit and a correction unit are achieved by main controller 50 of exposure apparatus 100 and control server 130 (to be more specific, the CPU of control server 130 and the software program), a model equation deriving unit and a variation amount computing unit are achieved by control server 130 (to be more specific, the CPU of control server 130 and the software program).

In other words, the data obtaining unit is achieved by the instructions in step 212 issued by the CPU of control server 130 and the processing of main controller 50 according to the instructions, the model equation deriving unit is achieved by the processing of step 216 performed by the CPU of control server 130, and the variation amount computing unit is achieved by the processing in step 238 performed by the CPU of control server 130. Further, the measurement executing unit is achieved by the instructions in step 224 issued by the CPU of control server 130 and the processing of main controller 50 according to the instructions, and the correction unit is achieved by the instructions in step 250 issued by the CPU of control server 130 and the processing of main controller 50 according to the instructions.

As is described above, in lithography system 300 of the embodiment, with respect to focus variation of exposure apparatus 100, control server 130 instructs exposure apparatus 100 to perform PM (refer to step 212) and makes exposure apparatus 100 execute PM, and registers data on focus variation factors (such as the temperature, the humidity, and the pressure within the environmental control chamber) and data on focus variation amounts corresponding to the focus variation factors in the database, every day for 30 days (one month) after exposure apparatus 100 is delivered.

Then, based on the database in which the respective data described above has been registered for one month, a factor analysis by multivariate analysis is performed and a model equation used to predict a focus variation amount is made (step 216). After making the model equation, based on the measurement data on focus variation factors obtained during the operation of exposure apparatus 100, a focus variation amount is computed using the above model equation (step 238), and based on the computed (predicted) focus variation amount, focus calibration is performed at predetermined timing (steps 238 and 250).

After making the model equation, the PM implementation interval is extended from every day to every week (once a week), and during one week after making the model equation, a focus variation amount is obtained by prediction computation using the model equation at predetermined timing (such as at predetermined intervals, or with respect to each predetermined number of wafers). In the case the obtained focus variation amount does not exceed threshold value fs' (e.g. 0.05 μm/day) set in advance all week continuously, the PM implementation interval is further changed (extended) from every week (once a week) to every other week (once a fortnight).

Incidentally, the prediction computation using the model equation is constantly performed a plurality of times a day, and the mean value of the results may be used. Further, in the embodiment above, the PM implementation interval is changed from one week to two weeks in the case it has been judged for 'all week continuously' that focus variation amount Δfocus is equal to or smaller than threshold value fs'. However, the present invention is not limited to 'all week', and the period may be changed (shortened).

Meanwhile, in the case the computed focus variation amount exceeds a permissible value fs (e.g. 0.1 μm/day) set in advance (that is, in the case an abnormal value is detected (in the case the judgment in step 240 is denied)) at any point of time during one week after making the model equation and after the PM implementation interval is extended to every other week, in the same manner as immediately after the delivery of exposure apparatus 100 described above, PM is executed every day for one month, data on focus variation factors (such as the temperature, the humidity and the pressure) and data on focus variation amounts are registered in the database, and a model equation used to predict a focus variation amount is newly made based on the data during the month (a model equation is updated).

In this manner, with the embodiment, prediction of the focus variation amount using the model equation and focus calibration using the prediction results of the predicted focus variation amount are performed, and in the case the predicted focus variation amount exceeds a permissible value (in this case, control based on the prediction results is not enough), PM (the measurement of the focus) is performed and the focus is calibrated based on the measurement results. With this operation, the control of focus with high accuracy becomes possible, and thus generation of exposure defect such as irregular colors caused by the defocus when transferring (exposing) a pattern can be effectively prevented.

Further, with the embodiment, because it becomes possible to predict the focus variation amount using the model equation, PM for focus check does not need to be performed every day as conventionally, and also in the case a prediction value of the focus variation amount does not exceed a threshold value predetermined times (for example, seven times) consecutively, the PM implementation interval is changed (extended) from every week to every other week, and therefore, the apparatus operation rate can be improved by reduction in downtime.

Although the description is omitted in the embodiment above in order to avoid complication of the description, in the exposure apparatus 100, a variation of the best focus position (the best image-forming plane position) of projection optical system PL is generated because projection optical system PL absorbs illumination light IL during exposure by the step-and-scan method. The defocus, which is caused by the variation of the best focus position due to absorption of illumination light IL by projection optical system PL, is corrected by computing an irradiation variation amount at the best focus position of projection optical system PL at predetermined computation intervals based on a model equation that is disclosed in, for example, Kokai (Japanese Unexamined Patent Application Publication) No. 11-258498 and the like, and performing focus control of the wafer during scanning exposure taking the computation results into consideration. However, when making the prediction algorithm database, an irradiation amount of illumination light IL to projection optical system PL (or an absorption amount of illumination light IL to projection optical system PL) and the like are made to be included in the variation factor data in the same manner as the temperature, the pressure (the atmospheric pressure) and the humidity, and a model equation used to estimate a focus variation amount (a focus offset of projection optical system PL) is made by performing the multivariate analysis described earlier based on the data including the irradiation amount of illumination light IL and the like, then a focus variation amount is obtained at each predetermined timing described earlier using the model equation taking into consideration the irradiation amount of illumination light IL to projection optical system PL and the like, and based on the results, focus calibration may be performed. In this case, the prediction computation may be performed by interrupt processing at about several millisecond intervals, which is further shorter than the intervals when the prediction computation is performed with respect to each wafer.

The inventors measured several tens of types of physical information, which includes the temperature, the humidity and the pressure of a clean room outside the exposure apparatus as a mater of course, a state of the exposure apparatus (including the most recent operation stop time and the like), and a focus variation amount, besides the temperature, the humidity and the pressure within the environmental control chamber of the exposure apparatus, and performed the multivariate analysis described above. As a consequence, they found that the humidity and the pressure within the environmental control chamber of the exposure apparatus affect focus variation the most.

Figure 5A:
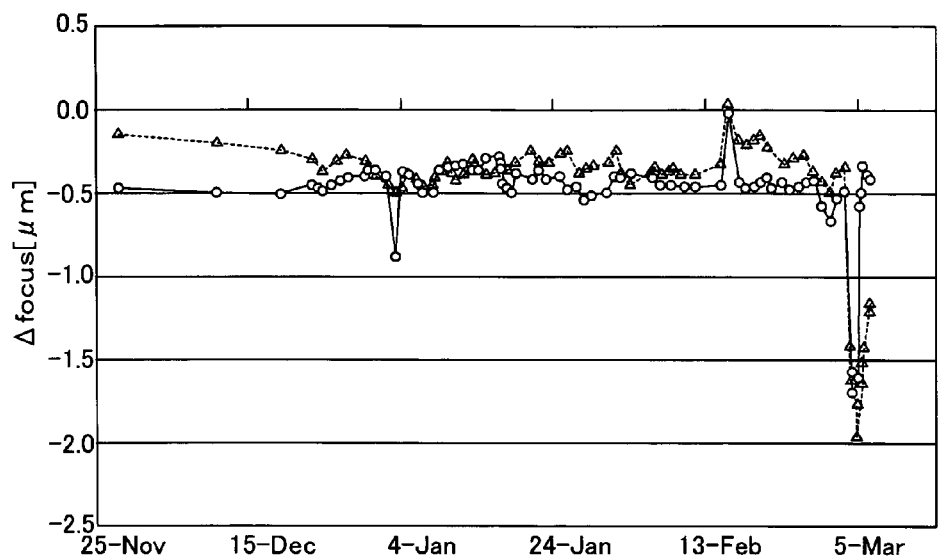
FIG. 5A is a graph showing the changes in an actual measurement value of a focus variation amount of an exposure apparatus and in a corresponding simulation result.

FIG. 5A shows a graph that indicates the changes in an actual measurement value (Δ) of a focus variation amount of an exposure apparatus and in a corresponding simulation result (○) for about three months from the end of November, 2003 to the beginning of March, 2004.

Figure 5B:
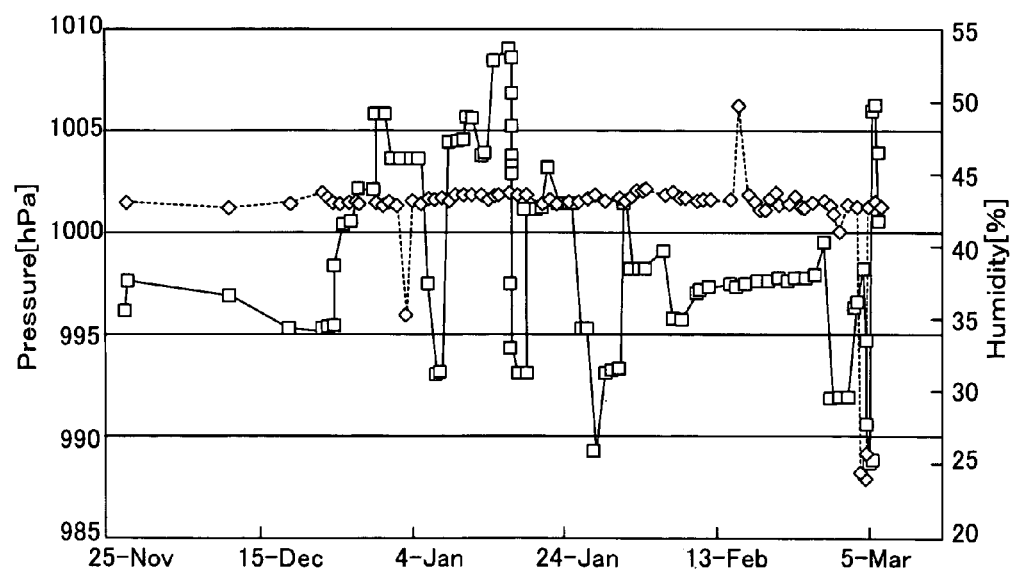
FIG. 5B is a graph showing the pressure and the humidity within an environmental control chamber of the exposure apparatus, which are monitored in accordance with the actual measurement of the focus variation amount in FIG. 5A.

Further, FIG. 5B is a graph that shows the pressure (□) and the humidity (♦) within the environmental control chamber of the exposure apparatus that are monitored in accordance with the actual measurement of the focus variation amount in FIG. 5A.

The actual value of FIG. 5A is a value that is measured using an aerial image focal point position detection system (a focal point position detection system by a TTL method), which will be described later. Incidentally, it is known that the measurement value of the aerial image measurement unit described in the embodiment above substantially coincides with the measurement value of the aerial image focal point position detection system. Further, the simulation result is obtained by performing multivariate analysis based on the monitor data on the pressure and the humidity in FIG. 5B and the actual measurement value of the focus variation amount in FIG. 5A, and performing prediction computation similar to the embodiment above using a model equation as shown in the following equation (4) obtained by the multivariate analysis.

$$\Delta focus = 16.5 + 0.013 \times Press. + 0.066 \times Humid. \tag{4}$$

When comparing FIG. 5A and FIG. 5B, it can be seen that the focus variation is strongly correlated with the humidity variation. Further, it can be seen that tendency of the actual measurement values by the aerial image focal point position detection system generally conform to that of simulation results (i.e. focus variation prediction results) and focus abnormality can be predicted and detected with good accuracy.

Incidentally, in the embodiment above, the case has been described in which after delivery of exposure apparatus 100, regarding focus variation, PM (the processing of step 212) is executed every day for 30 days (one month) with respect to each lot (at the timing before starting a processing of a wafer at the head of a lot), and the PM implementation interval is sequentially extended to every week and every other week after making a model equation. However, the interval of 30 days (one month), every day, every week, every other week or every lot as described above is one example, and the present invention is not limited to this interval. In other words, it is preferable to employ software in which any period or any interval can be freely designated.

Further, measurement of the best focus position on PM using the aerial image measurement unit described earlier is not limited to performing with respect to each lot, and may be performed with respect to every wafer or every designated number of wafers.

Incidentally, in the embodiment above, the case has been described in which control server 130 extends the measurement interval of the best focus position (the PM implementation interval) to every other week in the case a focus variation amount computed using the model equation does not exceed threshold value fs' set in advance predetermined times (7 times) in a row, and control server 130 shortens the measurement interval of the best focus position (the PM implementation interval) to every day in the case a focus variation amount computed using the model equation exceeds permissible value fs set in advance. However, the present invention is not limited to this, and a period of time required for the measurement of the best focus position may be changed (adjusted) based on a focus variation amount computed using the model equation. For example, control server 130 may shorten a period of time required for the measurement of the best focus position in the case a focus variation amount computed using the model equation does not exceed threshold value fs' set in advance predetermined times in a row, and may extend the period of time required for the measurement in the case a focus variation amount computed using the model equation exceeds permissible value fs set in advance. In this case, a measurement time changing unit is achieved by control server 130. Alternatively, control server 130 may extend the measurement interval of the best focus position (the PM implementation interval) and also shorten the period of time required for the measurement of the best focus position, or may shorten the measurement interval of the best focus position (the PM implementation interval) to every day and also extend the period of time required for the measurement. Incidentally, to change the PM implementation interval as described above based on a focus variation amount computed using the model equation is to change the number of PM implementation times. That is, the number of measurement times of data on focus variation factors (the temperature, the humidity, and the pressure in the environmental chamber) that is obtained by implementing PM and the number of the obtained data, and the number of measurement times of data on a corresponding focus variation amount and the number of obtained data decrease. In other words, the number of the obtained data on the best focus position (or the number of measurement times) and the number of the obtained data on focus variation factors (or the number of measurement times) are adjusted (changed). For example, control server 130 decreases the number of the data obtained by implementing PM, by extending a measurement interval of the best focus position (the PM implementation interval) to every other week in the case a focus variation amount computed using the model equation does not exceed threshold value fs' set in advance predetermined times (seven times) in a row; and increases the number of the data obtained by implementing PM, by shortening the PM implementation interval in the case a focus variation amount computed using the model equation exceeds permissible value fs set in advance. Further, regardless of the PM implementation interval, the number of data obtained by implementing PM once may be changed (increased or decreased) based on a focus variation amount computed using the model equation. For example, control server 130 decreases the number of the data obtained by implementing PM once in the case a focus variation amount computed using the model equation does not exceed threshold value fs' set in advance predetermined times (seven times) in a row, and increases the number of the data obtained by implementing PM once in the case a focus variation amount computed using the model equation exceeds permissible value fs set in advance.

Incidentally, in the embodiment above, the case has been described in which the best focus position of projection optical system PL on PM is measured in the method of aerial image measurement using aerial image measurement unit 59, however, the present invention is not limited to this, as a matter of course. For example, focusing attention on the point that overlay error measurement is executed by overlay measurement unit 120 with respect to several wafers at the head of each lot or a pilot wafer (a test wafer), test exposure may be performed to the pilot wafer in which a focus measurement mark as well as an overlay measurement mark are transferred. Then, when the overlay error is measured by overlay measurement unit 120, measurement of a line width or the like of a transferred image of the focus measurement mark may be measured.

In this case, the FEM described earlier may be formed on a test wafer, however, from the point of view of preventing the exposure time and the measurement time of the transferred image from unnecessarily becoming longer, as the focus measurement mark, a focus measurement mark that is not affected by an exposure amount (a dose) is preferably employed. As such a focus measurement mark, it is preferable to use two of dimension measurement marks (rhombus-shaped marks) whose phase difference is shifted by 90 degrees, such as the focus monitor that is disclosed in "Novel in-situ focus monitor technology in attenuated PSM under actual illumination condition", Program of $28^{th}$ SPIE 5040-49, p. 314, 2003, and the like. By performing the test exposure to the pilot wafer described above using a reticle (a mask) on which the focus measurement marks are formed, measuring resist images of two of dimension measurement marks respectively that are formed on the pilot wafer with an optical measuring instrument constituting overlay measurement unit 120, and obtaining a difference $\Delta L$ (=L1-L2) between measurement values (to be L1 and L2) of the resist images of two of dimension measurement marks, a focus value (including discrimination of sign (+, −) of the focus) can be measured independently of the change in a dose amount (without being affected by dose variation). This is because a phase shift of exposure light is equivalent to defocus on a wafer surface, the change of measurement value caused by the change in a dose amount is canceled out between two mark measurement values, a defocus correlation curve of a dimension value of each mark resist image becomes an even function curve with respect to +-defocus, and the like.

Incidentally, the measurement (the detection) of the best focus position using the aerial image measurement unit described above can be performed in a short period of time during a lot processing, however, the measurement (detection) accuracy is inferior, compared to measurement accuracy in the case the best focus position is measured by the test exposure described above. Therefore, comparison between the measurement result of the best focus position using the aerial image measurement unit and the measurement result of the best focus position by the test exposure is performed in advance, and when there is a deviation between them, the deviation is stored as an apparatus constant in the internal memory within main controller 50. Then, each time when measuring the best focus position using the aerial image measurement unit, the actual best focus position (the best image-forming plane position) is preferably computed taking the apparatus constant into consideration (that is, the best focus position measured by the aerial image measurement unit is converted into the measurement result of the best focus position by the test exposure). For example, in the embodiment above, the apparatus constant is obtained by performing the aforementioned comparison during one month for constructing database, and after one month lapses, measurement of a best focus value is executed periodically such as every week or every other week, using the aerial image measurement unit, and at every measurement the measurement result may be converted into the result of the test exposure to be used.

Further, in the case the measurement of the best focus position by the text exposure is performed when constructing database, data related to resist that is coated on a wafer, data related to antireflection film and the like, which are expected to affect exposure results, are made to be included in the focus variation factors described earlier, and the multivariate analysis may be performed.

Further, when the best focus position of projection optical system PL is obtained in other methods than the test exposure as in the embodiment described earlier, instead of the aerial image measurement unit, a means that can detect variation of a focal point position without actually performing exposure, for example, an aerial image focal point position detection system (a focal point position detection system by the TTL method) that is disclosed in, for example, Kokai (Japanese Unexamined Patent Application Publication) No. 05-190423, and the corresponding U.S. Pat. No. 5,502,311, and the like may be used. This aerial image focal point position detection system illuminates a light having the same wavelength with exposure light from the lower side to an emission mark that is formed on a fiducial mark plate (not shown) on Z tilt stage 38, projects the emission mark onto a reticle pattern surface via projection optical system PL, projects a reflected light from the reticle pattern surface to the emission mark on the fiducial mark plate via projection optical system PL, and photoelectrically detects an image projected overlaying an emission mark portion using a photodetection sensor arranged inside Z tilt stage 38. Since a mark does not need to be formed on a reticle in the case of the aerial image focal point position detection system, the best focus position at any point within a field of projection optical system PL can be detected based on the contrast of the images detected when changing the position of Z tilt stage 38 in the Z-axis direction. Accordingly, measurement of the best focus position at a point corresponding to any detection point of multiple focal point position detection system (60a, 60b) can be performed. As long as the national laws in designated states (or elected states), to which this international application is applied, permit, the above disclosures of the publication and the U.S. patent are incorporated herein by reference.

However, a sensitivity error may be included even in a sensor of such an aerial image focal point position detection system, and therefore, an actual best image-forming plane position is preferably computed performing the comparison with the test exposure result described earlier, obtaining the apparatus constant, and taking the apparatus constant into consideration.

Further, in the description so far, mainly from the point of view of preventing the description from being complicated excessively, as a performance of the exposure apparatus, the focus (the best focus position) is to be measured when performing PM. However, the present invention is not limited to this, and curvature of image plane (or inclination of image plane) of projection optical system may be measured. As is described earlier, on a pattern surface of measurement reticle Rm, a predetermined mark area is formed at 9 points within a rectangular-shaped area that has the substantially same shape as the illumination area described earlier, and therefore, by executing the measurement of the best focus position at each mark by the aerial image measurement described earlier, data on the best focus position at 9 points within an exposure area each corresponding to 9 evaluation points including the center within an effective field of projection optical system PL can be obtained. Then, based on the data on the best focus position at 9 points, the curvature of image plane or the inclination of image plane can be obtained by computing an approximate curvature or an approximate plane by the least-squares method. In the case the curvature of image plane has been obtained, adjustment of image-forming performance to correct the curvature of image plane may be performed prior to exposure, using an image-forming performance adjusting mechanism arranged in projection optical system PL, for example, a mechanism that changes the position and the posture of a specific lens constituting projection optical system PL, or a mechanism that changes the pressure of gas within a sealed space between specific lenses. Alternatively, in the case the inclination of image plane has been obtained, leveling of a wafer may be performed during scanning exposure taking the inclination of image plane into consideration.

Incidentally, when measuring the curvature of image plane or the inclination of image plane described above, the best focus position at 5 points within the exposure area each corresponding to 5 evaluation points in total that are the center and 4 corners of the effective field of projection optical system PL may be measured.

Further, in the embodiment above, in the case the best focus position and an image plane are measured based on the results of the test exposure to the pilot wafer, a focus measurement mark is transferred to a plurality of areas in the vicinity of the center and in the vicinity of the periphery of the pilot wafer, and the best focus position, the image plane and the like may be computed based on a mean value of the measurement results of line width or length of the resist image in each area. In this manner, due to averaging effect, improvement of the measurement precision can be expected by reducing measurement errors in line width measurement and the like.

Further, the performance of the exposure apparatus that is suitable to be controlled with the control system and the control method of the present invention is not limited to the image-forming performance of a projection optical system, and may be other performances, for example, stage position control performance (such as position control performance of wafer stage WST (including positioning accuracy), or synchronization accuracy of reticle stage RST and wafer stage WST) or the like.

For example, in the case the stage position control performance, more specifically, the positioning accuracy of wafer stage WST within the XY plane is subject to control, the control is performed in the flow A to D, which will be briefly described as follows.

A. After delivery of exposure apparatus 100, PM of stage accuracy variation is executed every other week (any interval can be designated) for three months (any period can be designated), and data on variation factors of the positioning accuracy of wafer stage WST within the XY plane (such as bending of movable mirror 52W on the wafer stage, stability of measurement values of interferometer 54W, or distortion of wafer holder 25) and actual measurement data ($3\sigma$ value (unit: nm)) on the positioning accuracy of wafer stage WST that corresponds to the variation factors are registered, for example, in the database within the large capacity storage described above.

B. Based on the database in which the data have been registered for three months, a model equation used to predict a variation amount of the positioning accuracy of wafer stage WST is derived by multivariate analysis.

C. After computing the model equation described above, the PM implementation interval is extended to every month, and based on the variation factor data during operation of exposure apparatus 100 and the model equation described above, a variation amount of the positioning accuracy of wafer stage WST is computed every day, and movement of wafer stage WST is controlled taking the computation results into consideration. Also, each time when computing a variation amount of the positioning accuracy of wafer stage WST, the computed variation amount is compared to a permissible value set in advance (the permissible value is, for example, 15 nm at $3\sigma$) and the PM implementation interval remains every month unless the computed variation amount exceeds the permissible value. As a matter of course, in the case the variation amount of the positioning accuracy of wafer stage WST is actually measured by PM, for example, an output of interferometer 54W is calibrated based on the actual measurement value.

D. Meanwhile, in the case the computed variation amount exceeds a permissible value set in advance (the permissible value is, for example, 15 nm at 3σ) as the result of the comparison described above, the processing of the above A and B is performed in the same manner after the delivery of the apparatus. With this processing, the model equation is updated.

The control method of stage control performance in the A to D described above can be realized without difficulty by making a program that is slightly changed from the program shown in the flowchart in FIG. 4 described earlier and installing the program in control server 130. The detailed description regarding this point will be omitted here.

In this manner, with the control method of stage control performance described above, the prediction of the variation amount of the stage positioning accuracy is performed using the model equation, wafer stage position control is performed using the prediction results of the predicted variation amount of the positioning accuracy, and in the case the predicted variation amount exceeds the permissible value (in this case, control based on the prediction results is not enough), PM (measurement of the positioning accuracy) is performed and, for example, the output of the interferometer is calibrated based on the measurement results. With this method, control of the stage position control performance can be made with high accuracy, which makes it possible to improve the overlay accuracy when transferring (exposing) a pattern.

Further, in the embodiment above, because it becomes possible to predict a variation amount of the stage position control performance using the model equation, PM to check the position control performance does not need to be performed periodically (every other week) unlike conventional methods, and the PM implementation interval can be maintained to a one-month interval unless the predicted value of the variation amount exceeds the permissible value, and therefore the apparatus operation rate can be improved.

The inventors performed the simulation in which prediction computation of a variation amount is performed using the model equation described above, with respect to the positioning accuracy of a wafer stage at an X coordinate minimum position, an X coordinate maximum position, a Y coordinate minimum position and a Y coordinate maximum position. As a result, it was confirmed that the stage accuracy monitoring results are stable in the long term, however, an abnormal value is generated in rare cases.

Incidentally, in the embodiment above, the case has been described in which the PM implementation interval is extended or shortened using two-step threshold values, i.e. threshold value (permissible value) fs and threshold value fs', based on magnitude relation between the prediction value of a focus variation amount and the threshold values. However, a threshold value does not necessarily have to be set in a plurality of steps, and only a permissible value may be set.

Further, in the embodiment above, the case has been described in which control server 130 constituting the lithography system executes an example of the control method of the present invention by performing a processing according to the program described earlier. However, the present invention is not limited to this, and an example of the control method of the present invention may naturally be executed by host computer 150 constituting the lithography system, as a matter of course, and also by the microcomputer serving as a control section of overlay measurement unit 120, the microcomputer serving as a control section within C/D110, or main controller 50 of exposure apparatus 100, which perform a processing according to a program similar to the program shown in the flowchart described earlier.

Incidentally, in the embodiment above, the case has been described in which the present invention is applied to the scanner. However, the present invention is not limited to the scanner, and can also be applied to a static exposure apparatus such as an exposure apparatus by a step-and-repeat method (a stepper). In such a case, for example instead of the multiple focal point position detection system described earlier, a multiple focal point position detection system that is similar to the one disclosed in, for example, Kokai (Japanese Unexamined Patent Application Publication) No. 05-275313, and the corresponding U.S. Pat. No. 5,502,311, and the like is used. In this multiple focal point position detection system, because detection points are set equally distant apart from one another in the entire range of a shot area on a wafer, when detecting the curvature of image plane and the inclination of image plane, the measurement of the best focus position may be performed at 5 or 9 evaluation points including the points at the center and 4 corners of the shot area. As long as the national laws in designated states (or elected states), to which this international application is applied, permit, the above disclosures of the publication and the U.S. patent are incorporated herein by reference.

Further, the magnification of the projection optical system in the exposure apparatus of the embodiment above is not limited to a reduction system, and the system may be either an equal magnifying system or a magnifying system. Also, projection optical system PL is not limited to a dioptric system, and the system may be a catoptric system or a catadioptric system, and the projected image may be either of an inverted image or an upright image.

Incidentally, in the embodiment above, the case has been described in which the ArF excimer laser beam is used as illumination light IL. However, the present invention is not limited to this, and not only the KrF excimer laser beam having a wavelength of 248 nm but also the light having the wavelength equal to or less than 170 nm, for example, other vacuum ultraviolet lights such as the F2 laser beam (a wavelength of 157 nm), or the $Kr_2$ laser beam (a wavelength of 146 nm) may be used.

Further, for example, the vacuum ultraviolet light is not limited to the laser beams referred to above, and a harmonic wave may also be used that is obtained by amplifying a single-wavelength laser beam in the infrared or visible range emitted by a DFB semiconductor laser or fiber laser, with a fiber amplifier doped with, for example, erbium (Er) (or both erbium and ytteribium (Yb)), and by converting the wavelength into ultraviolet light using a nonlinear optical crystal.

Further, in the embodiment above, illumination light IL of the exposure apparatus is not limited the light having the wavelength equal to or greater than 100 nm, and it is needless to say that the light having the wavelength less than 100 nm may be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (such as a wavelength range from 5 to 15 nm), and uses a total reflection reduction optical system designed under the exposure wavelength (such as 13.5 nm) and the reflective type mask has been developed. In the EUV exposure apparatus, the arrangement in which scanning exposure is performed by synchronously scanning a mask and a wafer using a circular arc illumination can be considered, and therefore the present invention can also be suitably applied to such an apparatus. Besides, for example, the present invention can also be suitably applied to an immersion exposure apparatus that has liquid filled in between projection optical system PL and a wafer, which is disclosed in, for example, the pamphlet of International Publication WO99/49504 and the like, or an exposure apparatus by a step-and-stitch method and an exposure apparatus by a proximity method.

Incidentally, in the embodiment above, the method for predicting and controlling a variation amount of a certain performance of the exposure apparatus has been described. However, the present invention is not limited to this, and can also be applied to performance control of other apparatuses than the exposure apparatus.

For example, the present invention can also be applied to a laser repair apparatus, a wafer inspection apparatus, a wafer measurement apparatus, a reticle inspection apparatus, a reticle measurement apparatus, and the like. As an example, in the case of the laser repair apparatus, a position control performance of a stage, which is arranged in the laser repair apparatus and moves while an object to be repaired is mounted on the stage, may be controlled in a method similar to the one in the case of the exposure apparatus above.

Further, as another example, a measuring system used to observe a reticle or a wafer at the best focus position is arranged in the reticle or wafer inspection apparatus. A focus variation amount at the measuring system or a curvature of image plane of an optical system arranged in the measuring system may be controlled in a method similar to the control method of the focus and the curvature of image plane in the exposure apparatus above.

Incidentally, the illumination optical system containing a plurality of lenses and the projection optical system are incorporated into the main body of the exposure apparatus and optical adjustment is performed, and also the reticle stage and the wafer stage that are made up of multiple mechanical parts are also attached to the main body of the exposure apparatus and the wiring and piping are connected. And then, total adjustment (such as electrical adjustment and operation check) is performed, which completes the making of the exposure apparatus of the embodiment above. The exposure apparatus is preferably built in a clean room where conditions such as the temperature and the degree of cleanliness are controlled.

The usage of the present invention is not limited to the exposure apparatus used for manufacturing semiconductor devices. The present invention can also be applied to an exposure apparatus for manufacturing displays including liquid crystal display devices which transfers a device pattern onto a glass plate, and to an exposure apparatus for manufacturing thin-film magnetic heads which transfers a device pattern onto a ceramic wafer, an exposure apparatus for manufacturing imaging devices (such as CCDs), micromachines, organic EL, DNA chips or the like. Further, the present invention can also be applied to an exposure apparatus that transfers a circuit pattern onto a glass substrate or a silicon wafer not only when producing microdevices such as semiconductors, but also when producing a reticle or a mask used in an exposure apparatus such as an optical exposure apparatus, an EUV exposure apparatus, an X-ray exposure apparatus, or an electron beam exposure apparatus. In this case, in the exposure apparatus that uses a DUV (far ultraviolet) light or a VUV (vacuum ultraviolet) light, a transmittance type reticle is used in general, and as the reticle substrate, materials such as silica glass, fluorine-doped silica glass, fluorite, magnesium fluoride, or crystal are used. In the X-ray exposure apparatus by the proximity method or the electron beam exposure apparatus, a transmittance type mask (a stencil mask, a membrane mask) is used, and as the mask substrate, a silicon wafer or the like is used.

Incidentally, the semiconductor device is manufactured by passing though a step in which function and performance design of the device is performed, a step in which a reticle is manufactured based on the design step, a step in which a wafer is manufactured using materials such as silicon, a lithography step in which a pattern formed on the mask is transferred onto a photosensitive object in the exposure apparatus of the embodiment above whose pattern transfer property is adjusted in the adjustment method described earlier, a device assembly step (including the dicing process, the bonding process, and the packaging process), an inspection step and the like. In this case, since the exposure apparatus which pattern transfer property is adjusted is used in the lithography step, the devices of higher-integration can be manufactured with good yield.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A control method of controlling a quality criteria of a predetermined apparatus that is installed in a clean room to manufacture micro-devices, the method comprising:

obtaining data related to a predetermined quality criteria, which includes at least one of an image-forming quality criteria of an optical system and a position control quality criteria of a stage which moves while an object is mounted thereon, and which has environmental conditions serving as variation factors, and data on the environmental conditions, by repeatedly executing a predetermined measurement at least one of at a set timing and at set intervals, wherein the predetermined apparatus comprises the optical system and the stage, and the environmental conditions include at least one of temperature, humidity and pressure in a controlled environment where the micro-devices are manufactured;

deriving a model equation used to predict a variation amount of the predetermined quality criteria that includes at least one of the environmental conditions as a variable, by performing multivariate analysis based on the obtained data;

obtaining data on the environmental condition that is the variable at a predetermined timing during operation of the predetermined apparatus, and computing a variation amount of the quality criteria based on the obtained data and the model equation;

adjusting an implementation timing of the predetermined measurement so that an implementation interval of the predetermined measurement lengthens in the case the variation amount of the quality criteria computed using the model equation does not exceed a value set in advance predetermined times in a row, and an implementation interval of the predetermined measurement shortens in the case the variation amount of the quality criteria computed using the model equation exceeds a permissible value set in advance; and controlling the quality criteria of the predetermined apparatus based on the model equation.

2. The control method of 2 claim 1, further comprising:
executing the predetermined measurement at the implementation interval adjusted based on the computed variation amount.

3. The control method of claim 1 wherein
a period of time required for the predetermined measurement is optimized based on a variation amount of the quality criteria computed using the model equation.

4. The control method of claim 3 wherein
a period of time required for the predetermined measurement is shortened in the case a variation amount of the quality criteria computed using the model equation does not exceed a value set in advance predetermined times in a row, and
a period of time required for the predetermined measurement is extended in the case a variation amount of the quality criteria computed using the model equation exceeds a permissible value set in advance.

5. The control method of Claim 1, further comprising:
correcting the quality criteria based on the computed variation amount.

6. The control method of Claim 1 wherein
the number of the obtained data is optimized based on a variation amount of the quality criteria computed using the model equation.

7. The control method of claim 6 wherein
in the case a variation amount of the quality criteria computed using the model equation does not exceed a value set in advance predetermined times in a row, the number of the obtained data is decreased, and
in the case a variation amount of the quality criteria computed using the model equation exceeds a permissible value set in advance, the number of the obtained data is increased.

8. The control method of claim 1 wherein
the predetermined measurement is executed at the time of maintenance of the predetermined apparatus.

9. The control method of claim 1 wherein
the predetermined apparatus is an exposure apparatus, and
the predetermined quality criteria is at least one of an offset of a detection origin of a measurement device that measures a positional relation between an image plane of a projection optical system and an object to be exposed with respect to an optical axis direction of the projection optical system, a best focus position of the projection optical system, and a focus offset of the projection optical system.

10. The control method of claim 9 wherein
the data related to the predetermined quality criteria is data on at least one of an offset of the detection origin of the measurement device and the best focus position, which are obtained as a result of executing at least one of measurement of an aerial image of a predetermined pattern and measurement of a transferred image of a predetermined pattern that is obtained as a result of a test exposure.

11. The control method of claim 9 wherein
the data related to the predetermined quality criteria is data on at least one of an offset of the detection origin of the measurement device and the best focus position, which are obtained based on data after conversion in which measurement data on the aerial image of the predetermined pattern is converted into measurement data on the transferred image of the predetermined pattern that is obtained as a result of the test exposure based on a known relation between the measurement data on the aerial image and the measurement data on the transferred image.

12. The control method of claim 1, wherein
the predetermined apparatus is an exposure apparatus, and
the predetermined quality criteria is a position control quality criteria of a stage on which an object to be exposed is mounted.

13. A control system that controls a quality criteria of a predetermined apparatus that is installed in a clean room to manufacture micro-devices, the system comprising:
a data obtaining device that obtains data related to a predetermined quality criteria, which includes at least one of an image-forming quality criteria of an optical system and a position control quality criteria of a stage which moves while an object is mounted thereon, and which has environmental conditions serving as variation factors, and data on the environmental conditions, by repeatedly executing a predetermined measurement at least one of at a set timing and at set intervals, wherein the predetermined apparatus comprises the optical system and the stage, and the environmental conditions include at least one of temperature, humidity and pressure in a controlled environment where the micro-devices are manufactured;
a model equation deriving device that derives a model equation used to predict a variation amount of the predetermined quality criteria that includes at least one of the environmental conditions as a variable, by performing multivariate analysis based on the obtained data;
a variation amount computing device that obtains data on the environmental condition that is the variable at a predetermined timing during operation of the predetermined apparatus, and computes a variation amount of the quality criteria based on the obtained data and the model equation;
an adjustment device that adjusts an implementation timing of the predetermined measurement so that an implementation interval of the predetermined measurement lengthens in the case the variation amount of the quality criteria computed using the model equation does not exceed a value set in advance predetermined times in a row, and an implementation interval of the predetermined measurement shortens in the case the variation amount of the quality criteria computed using the model equation exceeds a permissible value set in advance; and
a processing device that controls the quality criteria of the predetermined apparatus based on the model equation.

14. The control system of claim 13, further comprising:
a measurement executing device that executes the predetermined measurement at the implementation interval adjusted based on the computed variation amount.

15. The control system of claim 13 wherein
a period of time required for the predetermined measurement is optimized based on a variation amount of the quality criteria computed using the model equation.

16. The control system of claim 15, further comprising:
a measurement time changing device that shortens a period of time required for the predetermined measurement in the case a variation amount of the quality criteria computed using the model equation does not exceed a value set in advance predetermined times in a row, and extends a period of time required for the predetermined measurement in the case a variation amount of the quality criteria computed using the model equation exceeds a permissible value set in advance.

17. The control system of claim 13, further comprising:
a correction device that corrects the quality criteria based on the computed variation amount.

18. The control system of Claim 13 wherein
the number of the obtained data is optimized based on a variation amount of the quality criteria computed using the model equation.

19. The control system of claim 18 wherein
in the case a variation amount of the quality criteria computed using the model equation does not exceed a value set in advance predetermined times in a row, the number of the obtained data is decreased, and
in the case a variation amount of the quality criteria computed using the model equation exceeds a permissible value set in advance, the number of the obtained data is increased.

20. The control system of claim 13 wherein
the predetermined measurement is executed at the time of maintenance of the predetermined apparatus.

21. The control system of claim 13, further comprising:
a computer that online connects to the predetermined apparatus, wherein
at least a part of the data obtaining device and the model equation deriving device is arranged in one of the predetermined apparatus and the computer.

22. The control system of claim 13, wherein
the predetermined apparatus is an exposure apparatus, and the control system further comprises:
an image measurement device that online connects to the predetermined apparatus and measures a transferred image of a pattern that is formed on an object to be exposed, wherein
at least a part of the data obtaining device and the model equation deriving device is arranged in the image measurement device.

23. The control system of claim 13, wherein
the predetermined apparatus is an exposure apparatus, and the predetermined quality criteria is at least one of an offset of a detection origin of a measurement device that measures a positional relation between an image plane of the projection optical system and an object to be exposed with respect to an optical axis direction of a projection optical system, a best focus position of the projection optical system, and a focus offset of the projection optical system.

24. A computer readable storage medium storing an executable program that controls a quality criteria of a predetermined apparatus installed in a clean room to manufacture micro-devices, the program causing a computer to execute:
obtaining data related to a predetermined quality criteria, which includes at least one of an image-forming quality criteria of an optical system and a position control quality criteria of a stage which moves while an object is mounted thereon, and which has environmental conditions serving as variation factors, and data on the environmental conditions, by repeatedly executing a predetermined measurement at least one of at a set timing and at set intervals, wherein the predetermined apparatus comprises the optical system and the stage, and the environmental conditions include at least one of temperature, humidity and pressure in a controlled environment where the micro-devices are manufactured;
deriving a model equation, by performing multivariate analysis to determine an undetermined coefficient in the model equation used to predict a variation amount of the predetermined quality criteria that includes at least one of the environmental conditions as a variable, based on the obtained data;
obtaining data on the environmental condition that is the variable at a predetermined timing during operation of the predetermined apparatus, and computing a variation amount of the quality criteria based on the obtained data and the model equation;
performing a timing adjustment that shortens a period of time required for the predetermined measurement in the case the variation amount of the quality criteria computed using the model equation does not exceed a value set in advance predetermined times in a row, and that extends a period of time required for the predetermined measurement in the case the variation amount of the quality criteria computed using the model equation exceeds a permissible value set in advance; and
controlling the quality criteria of the predetermined apparatus based on the model equation.

25. The computer readable storage medium of Claim 24, wherein the program further causes the computer to execute:
executing the predetermined measurement at an implementation timing adjusted based on the computed variation amount.

26. The computer readable storage medium of Claim 24, wherein the program further causes the computer to execute:
optimizing a period of time required for the predetermined measurement based on a variation amount of the quality criteria computed using the model equation.

27. The computer readable storage medium of claim 26, wherein the program further causes the computer to execute:
a timing adjustment that shortens a period of time required for the predetermined measurement in the case a variation amount of the quality criteria computed using the model equation does not exceed a value set in advance predetermined times in a row, and that extends a period of time required for the predetermined measurement in the case a variation amount of the quality criteria computed using the model equation exceeds a permissible value set in advance.

28. The computer readable storage medium of Claim 24, wherein the program further causes the computer to execute:
optimizing the number of the obtained data based on a variation amount of the quality criteria computed using the model equation.

29. The computer readable storage medium of claim 28, wherein the program further causes the computer to execute:
a data adjustment that decreases the number of the obtained data in the case a variation amount of the quality criteria computed using the model equation does not exceed a value set in advance predetermined times in a row, and that increases the number of the obtained data in the case a variation amount of the quality criteria computed using the model equation exceeds a permissible value set in advance.

30. The computer readable storage medium of claim 24, wherein the program causes the computer to execute the predetermined measurement at the time of maintenance of the predetermined apparatus.

* * * * *